(12) United States Patent
Wang et al.

(10) Patent No.: US 11,641,720 B2
(45) Date of Patent: May 2, 2023

(54) CIRCUIT BOARD AND MANUFACTURING METHOD THEREOF

(71) Applicant: Unimicron Technology Corp., Taoyuan (TW)

(72) Inventors: Pei-Wei Wang, Taipei (TW); Shao-Chien Lee, Taipei (TW); Ra-Min Tain, Hsinchu County (TW); Chi-Chun Po, New Taipei (TW); Po-Hsiang Wang, New Taipei (TW); Pei-Chang Huang, Taoyuan (TW); Chin-Min Hu, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 263 days.

(21) Appl. No.: 17/224,078

(22) Filed: Apr. 6, 2021

(65) Prior Publication Data

US 2022/0095464 A1  Mar. 24, 2022

Related U.S. Application Data

(60) Provisional application No. 63/080,037, filed on Sep. 18, 2020.

(30) Foreign Application Priority Data

Feb. 1, 2021  (TW) .................. 110103630

(51) Int. Cl.
*H05K 3/46* (2006.01)
*H05K 1/02* (2006.01)
*H05K 3/34* (2006.01)

(52) U.S. Cl.
CPC ......... *H05K 3/4697* (2013.01); *H05K 1/0204* (2013.01); *H05K 1/0298* (2013.01); *H05K 3/3452* (2013.01)

(58) Field of Classification Search
CPC .. H05K 3/4697; H05K 1/0204; H05K 1/0298; H05K 3/3452; H05K 1/183; H05K 3/0061
See application file for complete search history.

(56) References Cited

U.S. PATENT DOCUMENTS 5,615,087 A * 3/1997 Wieloch ................ H01L 23/367
257/E23.101
5,923,084 A * 7/1999 Inoue ................... H01L 23/3121
257/E23.125

(Continued)

FOREIGN PATENT DOCUMENTS

CN  106664793  5/2017
TW  201911984  3/2019

OTHER PUBLICATIONS

"Office Action of Taiwan Counterpart Application", dated Apr. 25, 2022, p. 1-p. 11.

*Primary Examiner* — Sherman Ng
(74) *Attorney, Agent, or Firm* — JCIPRNET

(57) ABSTRACT

A circuit board includes a composite structure layer, at least one conductive structure, a thermally conductive substrate, and a thermal interface material layer. The composite structure layer has a cavity and includes a first structure layer, a second structure layer, and a connecting structure layer. The first structure layer includes at least one first conductive member, and the second structure layer includes at least one second conductive member. The cavity penetrates the first structure layer and the connecting structure layer to expose the second conductive member. The conductive structure at least penetrates the connecting structure layer and is electrically connected to the first conductive member and the second conductive member. The thermal interface material layer is disposed between the composite structure layer and the thermally conductive substrate, and the second structure (Continued)

layer is connected to the thermally conductive substrate through the thermal interface material layer.

16 Claims, 29 Drawing Sheets

(56) References Cited

U.S. PATENT DOCUMENTS

| | | | |
|---|---|---|---|
| 6,324,067 B1* | 11/2001 | Nishiyama | H05K 1/183 |
| | | | 428/209 |
| 6,400,573 B1* | 6/2002 | Mowatt | H05K 1/117 |
| | | | 361/764 |
| 6,768,064 B2 | 7/2004 | Higuchi et al. | |
| 9,177,938 B2 | 11/2015 | Tani et al. | |
| 10,177,067 B2 | 1/2019 | Wang et al. | |
| 2006/0120058 A1* | 6/2006 | Fairchild | H01L 23/13 |
| | | | 257/E23.101 |
| 2009/0175017 A1* | 7/2009 | Kita | H01L 21/4857 |
| | | | 361/792 |
| 2012/0227261 A1* | 9/2012 | Inui | H05K 1/0206 |
| | | | 29/849 |
| 2020/0144192 A1* | 5/2020 | Choi | H01L 23/367 |

\* cited by examiner

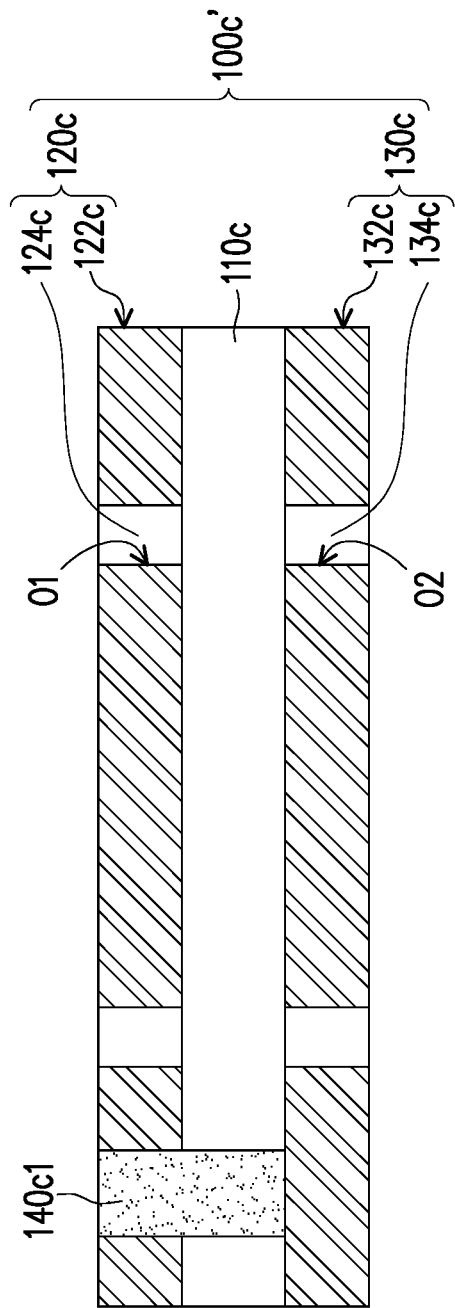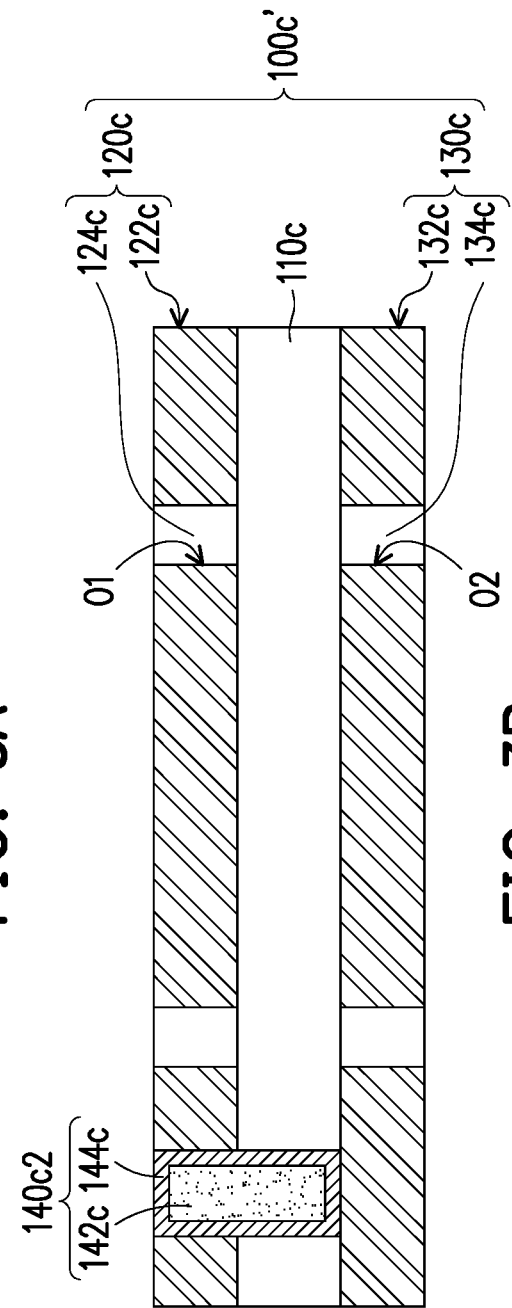
FIG. 3A
FIG. 3B

CIRCUIT BOARD AND MANUFACTURING METHOD THEREOF

CROSS-REFERENCE TO RELATED APPLICATION

This application claims the priority benefits of U.S. provisional application Ser. No. 63/080,037, filed on Sep. 18, 2020, and Taiwan application serial no. 110103630, filed on Feb. 1, 2021. The entirety of each of the above-mentioned patent applications is hereby incorporated by reference herein and made a part of this specification.

BACKGROUND

Technical Field

The disclosure relates to a substrate structure and a manufacturing method thereof, and particularly relates to a circuit board and a manufacturing method thereof.

Description of Related Art

Generally speaking, metal substrates are commonly used in the assembly of light emitting diodes (LEDs). A substrate made of metal has good heat dissipation, but the operating power is not high. Furthermore, a metal substrate has only one circuit layer. Because of the circuit, the functions provided after assembly may not be enough. As a result, the main application is limited to solving the heat dissipation problem.

SUMMARY

The disclosure provides a circuit board including a composite structure layer, which has at least two layers of conductive members and has a good heat dissipation effect.

The disclosure further provides a manufacturing method for manufacturing the circuit board.

A circuit board according to the disclosure includes a composite structure layer, at least one conductive structure, a thermally conductive substrate, and a thermal interface material layer. The composite structure layer has a cavity and includes a first structure layer, a second structure layer, and a connecting structure layer. The connecting structure layer connects the first structure layer and the second structure layer. The first structure layer includes at least one first conductive member and the second structure layer includes at least one second conductive member. The cavity penetrates the first structure layer and the connecting structure layer to expose the at least one second conductive member of the second structure layer. The conductive structure at least penetrates the connecting structure layer and is electrically connected to the first conductive member of the first structure layer and the second conductive member of the second structure layer. The thermally conductive substrate is disposed on a side of the composite structure layer. The thermal interface material layer is disposed between the composite structure layer and the thermally conductive substrate, and the second structure layer is connected to the thermally conductive substrate through the thermal interface material layer.

In an embodiment of the disclosure, the first structure layer further includes an insulating layer, the first conductive member includes multiple circuit layers, and the multiple circuit layers are disposed in the insulating layer and on two opposite surfaces of the insulating layer. The second structure layer further includes an insulating resin, the second conductive member is a metal plate, the metal plate has a plurality of openings, and the insulating resin fills the openings. The conductive structure passes through the connecting structure layer to electrically connect a bottom circuit layer of the multiple circuit layers and the metal plate.

In an embodiment of the disclosure, the first structure layer further includes a first insulating layer, and the first conductive member is a first circuit layer. The first circuit layer has a plurality of first openings, the first insulating layer is located in the first openings, the first insulating layer is flush with the first circuit layer. The second structure layer further includes a second insulating layer, and the second conductive member is a second circuit layer. The second circuit layer has a plurality of second openings, the second insulating layer is located in the second openings, and the second insulating layer is flush with the second circuit layer. The conductive structure passes through the connecting structure layer to electrically connect the first circuit layer of the first structure layer and the second circuit layer of the second structure layer.

In an embodiment of the disclosure, the conductive structure further passes through the first circuit layer of the first structure layer.

In an embodiment of the disclosure, the conductive structure includes an electroplated metal layer and a resin layer. The resin layer penetrates the first circuit layer of the first structure layer and the connecting structure layer. The electroplated metal layer covers all surfaces of the resin layer.

In an embodiment of the disclosure, the conductive structure further passes through the first circuit layer of the first structure layer, the second circuit layer of the second structure layer, the thermal interface material layer, and a part of the thermally conductive substrate.

In an embodiment of the disclosure, the conductive structure includes an electroplated metal layer and a resin layer. The resin layer penetrates the first circuit layer of the first structure layer, the connecting structure layer, the second circuit layer of the second structure layer, the thermal interface material layer, and a part of the thermally conductive substrate. The electroplated metal layer covers all surfaces of the resin layer.

In an embodiment of the disclosure, the conductive structure includes an electroplated metal layer and a resin layer. The resin layer penetrates the first circuit layer of the first structure layer, the connecting structure layer, the second circuit layer of the second structure layer, the thermal interface material layer, and a part of the thermally conductive substrate. The electroplated metal layer covers a surface of the resin layer that penetrates the second circuit layer of the second structure layer, the thermal interface material layer, and a part of the thermally conductive substrate.

In an embodiment of the disclosure, the circuit board further includes a solder mask layer disposed on the first structure layer and exposing a part of the first conductive member. The cavity passes through the solder mask layer, the first structure layer, and the connecting structure layer to expose an upper surface of the second conductive member of the second structure layer.

In an embodiment of the disclosure, the circuit board further includes a surface treatment layer disposed on the first conductive member exposed by the solder mask layer and on the upper surface of the second conductive member exposed by the cavity.

In an embodiment of the disclosure, the surface treatment layer is further disposed on a surface of the thermally conductive substrate relatively far away from the composite structure layer.

In an embodiment of the disclosure, a material of the surface treatment layer includes electroless nickel electroless palladium immersion gold (ENEPIG), electroless nickel immersion gold (ENIG) or an organic solderability preservative (OSP).

In an embodiment of the disclosure, a material of the connecting structure layer includes polypropylene (PP), an Ajinomoto build-up film (ABF), glass fiber (FR4) or a thermal interface material (TIM).

In an embodiment of the disclosure, a thermal conductivity of the thermal interface material layer is equal to or greater than 8 W/(m·K).

In an embodiment of the disclosure, a material of the thermally conductive substrate includes metal or ceramic.

A manufacturing method of a circuit board of the disclosure includes the following. A composite structure layer is provided. The composite structure layer includes a first structure layer, a second structure layer, and a connecting structure layer. The connecting structure layer connects the first structure layer and the second structure layer. The first structure layer includes at least one first conductive member and the second structure layer includes at least one second conductive member. At least one conductive structure is formed to at least penetrate the connecting structure layer and be electrically connected to the first conductive member of the first structure layer and the second conductive member of the second structure layer. A thermally conductive substrate and a thermal interface material layer are provided, and the thermal interface material layer is located between the composite structure layer and the thermally conductive substrate. The composite structure layer, the thermal interface material layer, and the thermally conductive substrate are compressed so that the second structure layer is connected to the thermally conductive substrate through the thermal interface material layer. A cavity is formed to penetrate the first structure layer and the connecting structure layer to expose the second conductive member of the second structure layer.

In an embodiment of the disclosure, the conductive structure is formed when the composite structure layer is provided. Providing the composite structure layer includes: providing the first structure layer. The first structure layer further includes an insulating layer, the first conductive member includes multiple circuit layers, and the multiple circuit layers are disposed in the insulating layer and on two opposite surfaces of the insulating layer. The second conductive member is provided, and the second conductive member is a metal plate. The metal plate has an upper surface and a lower surface opposite to each other, a plurality of first blind holes extending in a direction from the upper surface to the lower surface, and a plurality of second blind holes extending in a direction from the lower surface to the upper surface. The first blind holes respectively correspond to the second blind holes. The connecting structure layer is provided between the first structure layer and the metal plate. The conductive structure passes through the connecting structure layer, and the connecting structure layer is in a B-stage state. The first structure layer, the connecting structure layer, and the metal plate are compressed so that the conductive structure is connected to the multiple circuit layers and the metal plate, and the connecting structure layer changes from the B-stage state to a C-stage state. A part of the metal plate is removed so that the first blind holes communicate with the second blind holes to define a plurality of openings. An insulating resin is filled in the openings. The insulating resin fills the openings, the insulating resin is flush with two surfaces of the metal plate, and the metal plate and the insulating resin define the second structure layer.

In an embodiment of the disclosure, the conductive structure is formed when the composite structure layer is provided. Providing the composite structure layer includes: providing a first conductive layer and a second conductive layer. The connecting structure layer is provided between the first conductive layer and the second conductive layer, and the conductive structure passes through the connecting structure layer, and the connecting structure layer is in a B-stage state. The first conductive layer, the connecting structure layer, and the second conductive layer are compressed so that the conductive structure is connected to the first conductive layer and the second conductive layer, and the connecting structure layer changes from the B-stage state a C-stage state. The first conductive layer and the second conductive layer are patterned to form a first circuit layer having a plurality of first openings and a second circuit layer having a plurality of second openings. The first conductive member is the first circuit layer, and the second conductive member is the second circuit layer. A first insulating layer is formed in the first openings and a second insulating layer is formed in the second openings. The first insulating layer is flush with the first circuit layer, and the second insulating layer is flush with the second circuit layer. The first insulating layer and the first circuit layer define the first structure layer, and the second insulating layer and the second circuit layer define the second structure layer.

In an embodiment of the disclosure, the conductive structure is formed when the composite structure layer is provided. Providing the composite structure layer includes: providing a first conductive layer and a second conductive layer. The connecting structure layer is provided between the first conductive layer and the second conductive layer, and the connecting structure layer is in a B-stage state. The first conductive layer, the connecting structure layer, and the second conductive layer are compressed so that the connecting structure layer changes from the B-stage state to a C-stage state. The conductive structure is formed to pass through the first conductive layer and the connecting structure layer, and the conductive structure is electrically connected to the first conductive layer and the second conductive layer. The first conductive layer and the second conductive layer are patterned to form a first circuit layer having a plurality of first openings and a second circuit layer having a plurality of second openings. The first conductive member is the first circuit layer, and the second conductive member is the second circuit layer. A first insulating layer is formed in the first openings and a second insulating layer is formed in the second openings. The first insulating layer is flush with the first circuit layer, and the second insulating layer is flush with the second circuit layer. The first insulating layer and the first circuit layer define the first structure layer, and the second insulating layer and the second circuit layer define the second structure layer.

In an embodiment of the disclosure, the conductive structure includes an electroplated metal layer and a resin layer. The resin layer penetrates the first circuit layer of the first structure layer and the connecting structure layer, and the electroplated metal layer covers all surfaces of the resin layer.

In an embodiment of the disclosure, providing the composite structure layer includes: providing a first conductive layer and a second conductive layer. The connecting structure layer is provided between the first conductive layer and the second conductive layer, and the connecting structure layer is in a B-stage state. The first conductive layer, the connecting structure layer, and the second conductive layer are compressed so that the connecting structure layer changes from the B-stage state to a C-stage state. The first conductive layer and the second conductive layer are patterned to form a first circuit layer having a plurality of first openings and a second circuit layer having a plurality of second openings. The first conductive member is the first circuit layer, and the second conductive member is the second circuit layer. A first insulating layer is formed in the first openings and a second insulating layer is formed in the second openings. The first insulating layer is flush with the first circuit layer, and the second insulating layer is flush with the second circuit layer. The first insulating layer and the first circuit layer define the first structure layer, and the second insulating layer and the second circuit layer define the second structure layer.

In an embodiment of the disclosure, the conductive structure is formed after the composite structure layer, the thermal interface material layer, and the thermally conductive substrate are compressed. The conductive structure passes through the first circuit layer of the first structure layer, the connecting structure layer, the second circuit layer of the second structure layer, the thermal interface material layer, and a part of the thermally conductive substrate.

In an embodiment of the disclosure, the conductive structure includes an electroplated metal layer and a resin layer. The resin layer penetrates the first circuit layer of the first structure layer, the connecting structure layer, the second circuit layer of the second structure layer, the thermal interface material layer, and a part of the thermally conductive substrate, and the electroplated metal layer covers all surfaces of the resin layer.

In an embodiment of the disclosure, the manufacturing method of the circuit board further includes: removing the conductive structure located in the first structure layer and the connecting structure layer to form a hole before the cavity is formed. Another resin layer is filled in the hole, and the another resin layer fills the hole and contacts a remaining part of the conductive structure.

In an embodiment of the disclosure, the manufacturing method of the circuit board further includes: forming a solder mask layer on the first structure layer before the cavity is formed. The solder mask layer exposes a part of the first conductive member, and the cavity passes through the solder mask layer, the first structure layer, and the connecting structure layer to expose an upper surface of the second conductive member of the second structure layer.

In an embodiment of the disclosure, the manufacturing method of the circuit board further includes: forming a surface treatment layer on the first conductive member exposed by the solder mask layer and on the upper surface of the second conductive member exposed by the cavity after the solder mask layer is formed.

In an embodiment of the disclosure, the surface treatment layer is further formed on a surface of the thermally conductive substrate relatively far away from the composite structure layer.

In an embodiment of the disclosure, a material of the surface treatment layer includes electroless nickel electroless palladium immersion gold (ENEPIG), electroless nickel immersion gold (ENIG) or an organic solderability preservative (OSP).

In an embodiment of the disclosure, a material of the connecting structure layer includes polypropylene (PP), an Ajinomoto build-up film (ABF), glass fiber (FR4) or a thermal interface material (TIM).

In an embodiment of the disclosure, a thermal conductivity of the thermal interface material layer is equal to or greater than 8 W/(m·K).

In an embodiment of the disclosure, a material of the thermally conductive substrate includes metal or ceramic.

Based on the above, in the design of the circuit board of the disclosure, the composite structure layer includes the first structure layer, the second structure layer, and the connecting structure layer. The first structure layer and the second structure layer respectively include conductive members, and the conductive structure connects the conductive members of the first structure layer and the second structure layer, and the second structure layer of the composite structure layer is connected to the thermally conductive substrate through the thermal interface material layer. In this way, the circuit board of the disclosure not only can dissipate heat through the thermally conductive substrate but also has at least two layers of conductive members (for example, circuit layers) for use.

In order to make the above and other features of the disclosure more comprehensible, several exemplary embodiments are described in detail hereinafter with reference to the accompanying drawings.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 3A is a schematic cross-sectional view of a composite structure layer and a conductive structure according to an embodiment of the disclosure.

FIG. 3B to FIG. 3F are schematic cross-sectional views showing some steps of a manufacturing method of a circuit board according to another embodiment of the disclosure.

DETAILED DESCRIPTION OF DISCLOSED EMBODIMENTS

FIG. 1A to FIG. 1F are schematic cross-sectional views showing a manufacturing method of a circuit board according to an embodiment of the disclosure. Regarding the manufacturing method of the circuit board of this embodiment, first, referring to FIG. 1C, a composite structure layer 100a' is provided. The composite structure layer 100a' includes a first structure layer 120a, a second structure layer 130a, and a connecting structure layer 110a. The connecting structure layer 110a connects the first structure layer 120a and the second structure layer 130a.

Figure 1A:
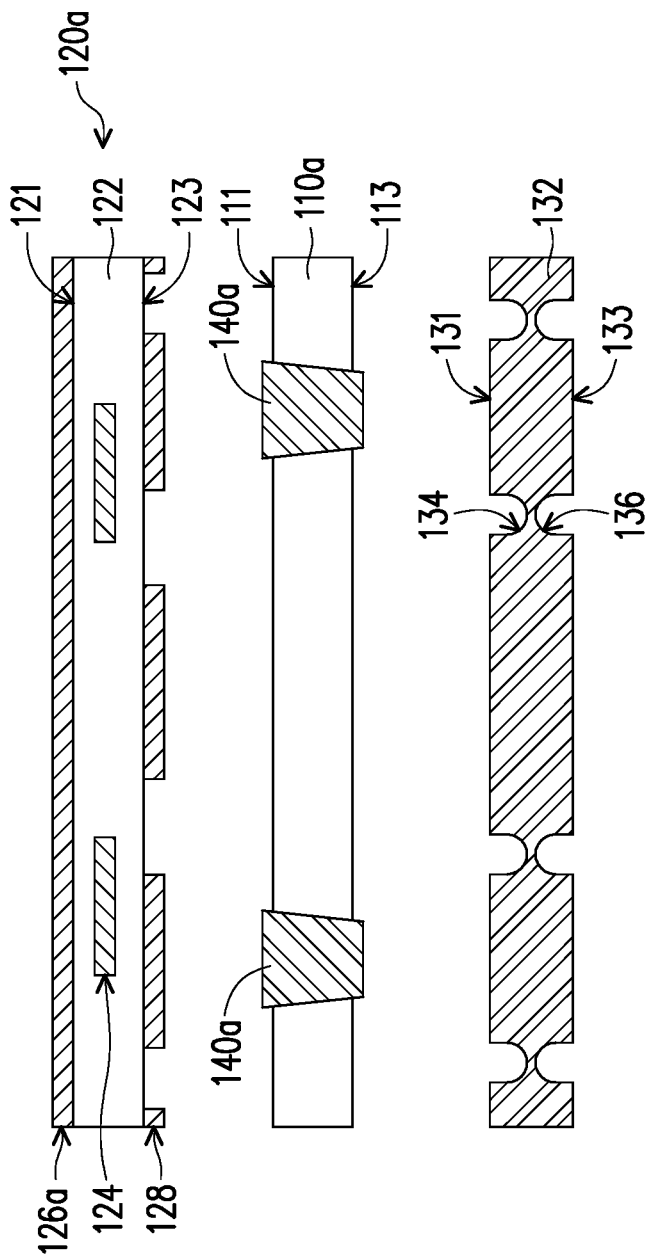
FIG. 1A to FIG. 1F are schematic cross-sectional views showing a manufacturing method of a circuit board according to an embodiment of the disclosure.

In detail, in the step of providing the composite structure layer 100a', first, referring to FIG. 1A, the first structure layer 120a is provided. The first structure layer 120a includes at least one first conductive member and an insulating layer 122, wherein the at least one first conductive member is, for example, multiple circuit layers 124, 126a, and 128, and the multiple circuit layers 124, 126a, and 128 are disposed in the insulating layer 122 and on two opposite surfaces 121 and 123 of the insulating layer 122. Here, the circuit layers 124 and 128 are respectively patterned circuit layers, and the circuit layer 126a is an unpatterned circuit layer and completely covers the surface 121 of the insulating layer 122. That is, the first structure layer 120a is substantially a multi-layered circuit board, but not limited thereto. Next, a second conductive member is provided, wherein the second conductive member is a metal plate 132. Here, the metal plate 132 is, for example, a copper plate or a copper foil. The metal plate 132 has an upper surface 131 and a lower surface 133 opposite to each other, a plurality of first blind holes 134 extending in a direction from the upper surface 131 to the lower surface 133, and a plurality of second blind holes 136 extending in a direction from the lower surface 133 to the upper surface 131. The first blind holes 134 correspond to the second blind holes 136 respectively. Then, the connecting structure layer 110a is provided between the first structure layer 120a and the metal plate 132, wherein the material of the connecting structure layer 110a is, for example, polypropylene (PP), an Ajinomoto build-up film (ABF), glass fiber (FR4) or a thermal interface material (TIM), but not limited thereto. Here, the thickness of the connecting structure layer 110a is, for example, 20 micrometers to 100 micrometers. In particular, the connecting structure layer 110a at this time is in a B-stage state, which means that the connecting structure layer 110a is not completely cured. Finally, at least one conductive structure (two conductive structures 140a are schematically shown) is formed to penetrate the connecting structure layer 110a. At this time, the conductive structure 140a protrudes from two opposite surfaces 111 and 113 of the connecting structure layer 110a.

Figure 1B:
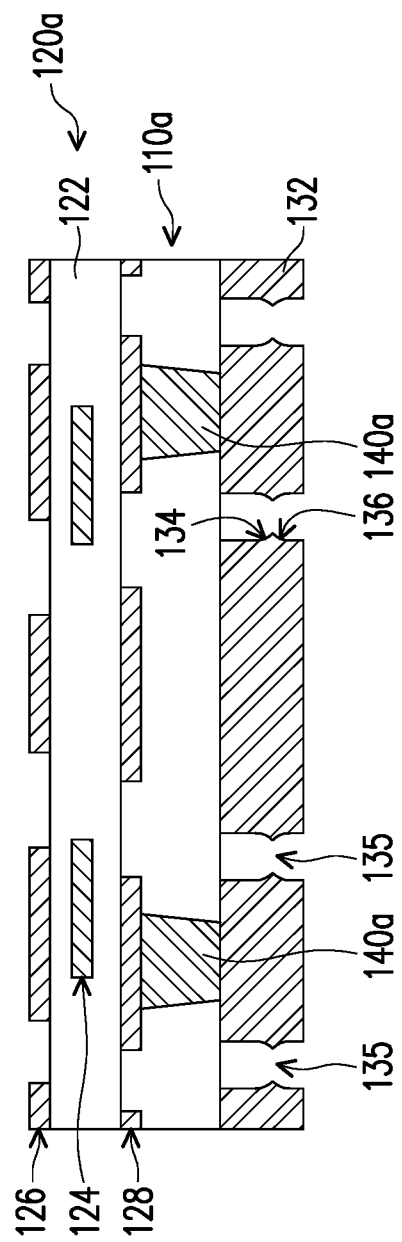

Next, referring to FIG. 1B, the first structure layer 120a, the connecting structure layer 110a, and the metal plate 132 are compressed by a hot pressing method, so that the conductive structure 140a is structurally and electrically connected to the circuit layer 128 and the metal plate 132. At this time, the connecting structure layer 110a may change from the B-stage state to a C-stage state, which means that the connecting structure layer 110a is completely cured. Then, a part of the metal plate 132 is removed so that the first blind holes 134 communicate with the second blind holes 136 to define a plurality of openings 135. In addition, a patterning process may also be performed on the circuit layer 126a of the first structure layer 110a to form a patterned circuit layer 126.

Figure 1C:
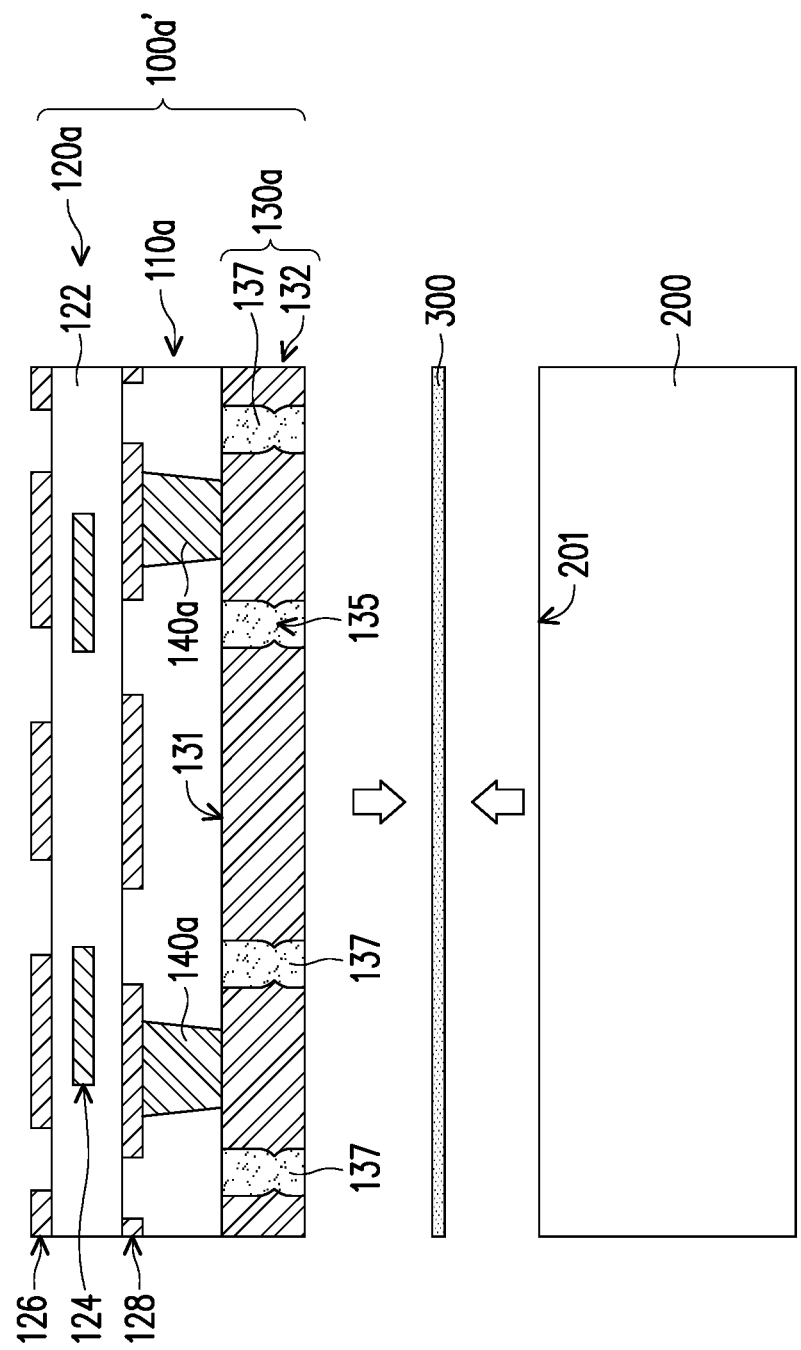

Next, referring to FIG. 1C, an insulating resin 137 is filled in the opening 135, wherein the insulating resin 137 fills the opening 135, and the insulating resin 137 is flush with the two surfaces 131 and 133 of the metal plate 132, and the metal plate 132 and the insulating resin 137 define the second structure layer 130a. At this point, the manufacture of the composite structure layer 100a' and the conductive structure 140a is completed.

Next, referring to FIG. 1C again, a thermally conductive substrate 200 and a thermal interface material layer 300 are provided, wherein the thermal interface material layer 300 is located between the composite structure layer 100a' and the thermally conductive substrate 200. Here, the thermal conductivity of the thermal interface material layer 300 is, for example, equal to or greater than 8 W/(m·K), and the material of the thermally conductive substrate 200 is, for example, ceramic or metal, such as aluminum or copper, but not limited thereto. At this time, the thermal interface material layer 300 is in a B-stage state, which means that the thermal interface material layer 300 is not completely cured.

Figure 1D:
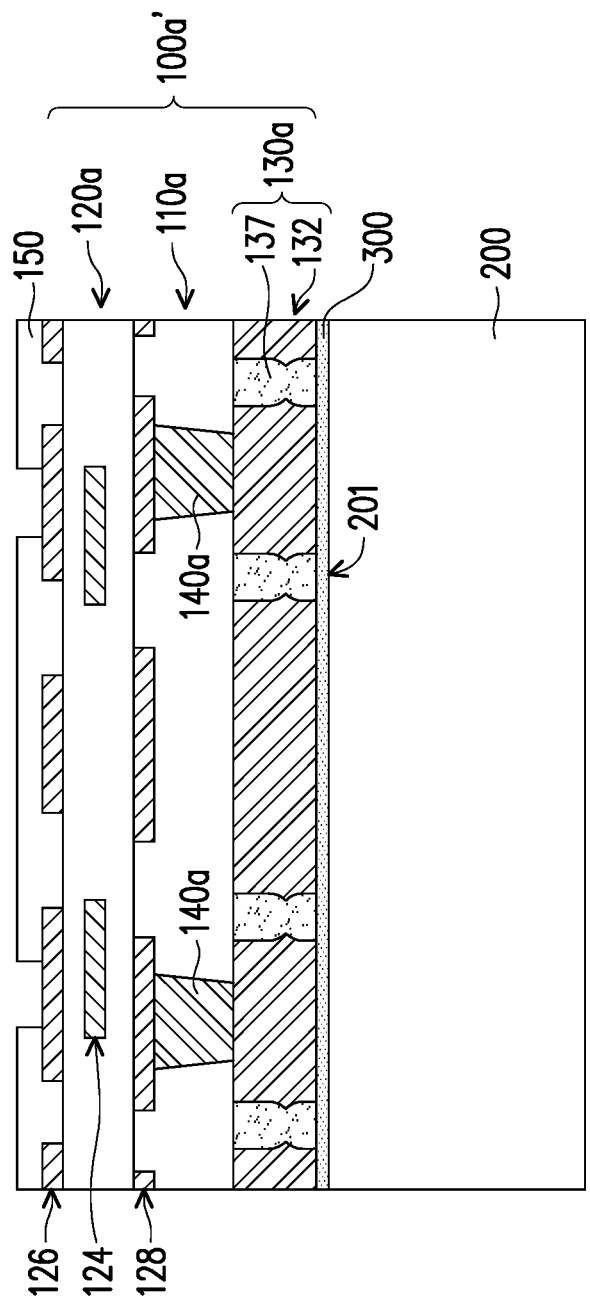
Figure 1E:
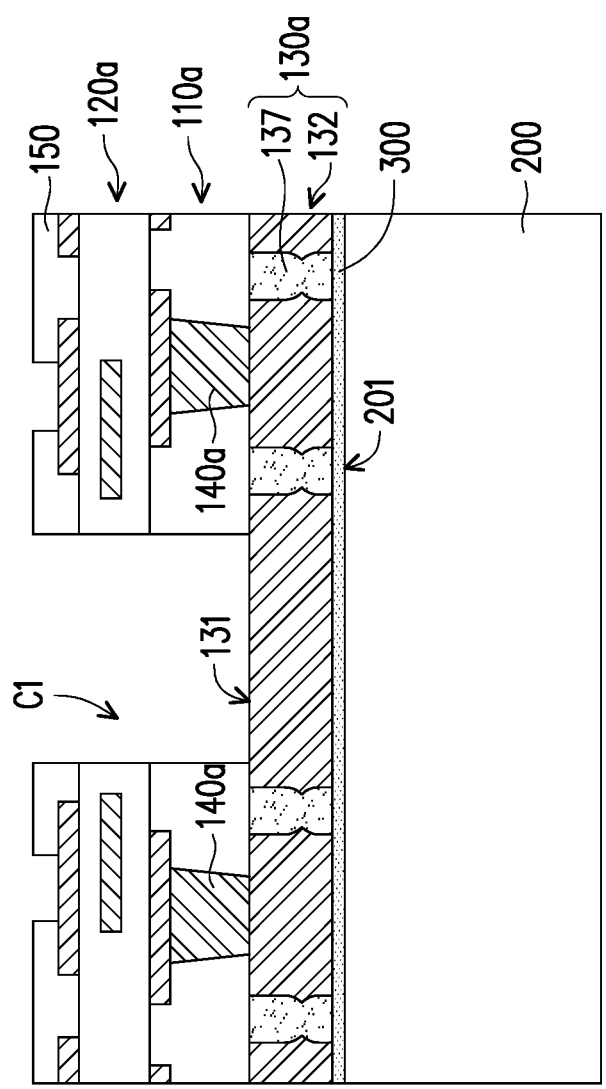

Next, referring to FIG. 1C and FIG. 1D, the composite structure layer 100a', the thermal interface material layer 300, and the thermally conductive substrate 200 are compressed so that the metal plate 132 of the second structure layer 130a is connected to the thermally conductive substrate 200 through the thermal interface material layer 300. At this time, the thermal interface material layer 300 may change from the B-stage state to a C-stage state, which means that the thermal interface material layer 300 is completely cured.

Next, referring to FIG. 1D again, a solder mask layer 150 is formed on the first structure layer 120a. The solder mask layer 150 exposes a part of the first conductive member (that is, the circuit layer 126). Then, referring to FIG. 1E, a cavity C1 is formed to penetrate the solder mask layer 150, the first structure layer 120a, and the connecting structure layer 110a to expose the upper surface 131 of the second conductive member (that is, the metal plate 132) of the second structure layer 130a.

Figure 1F:
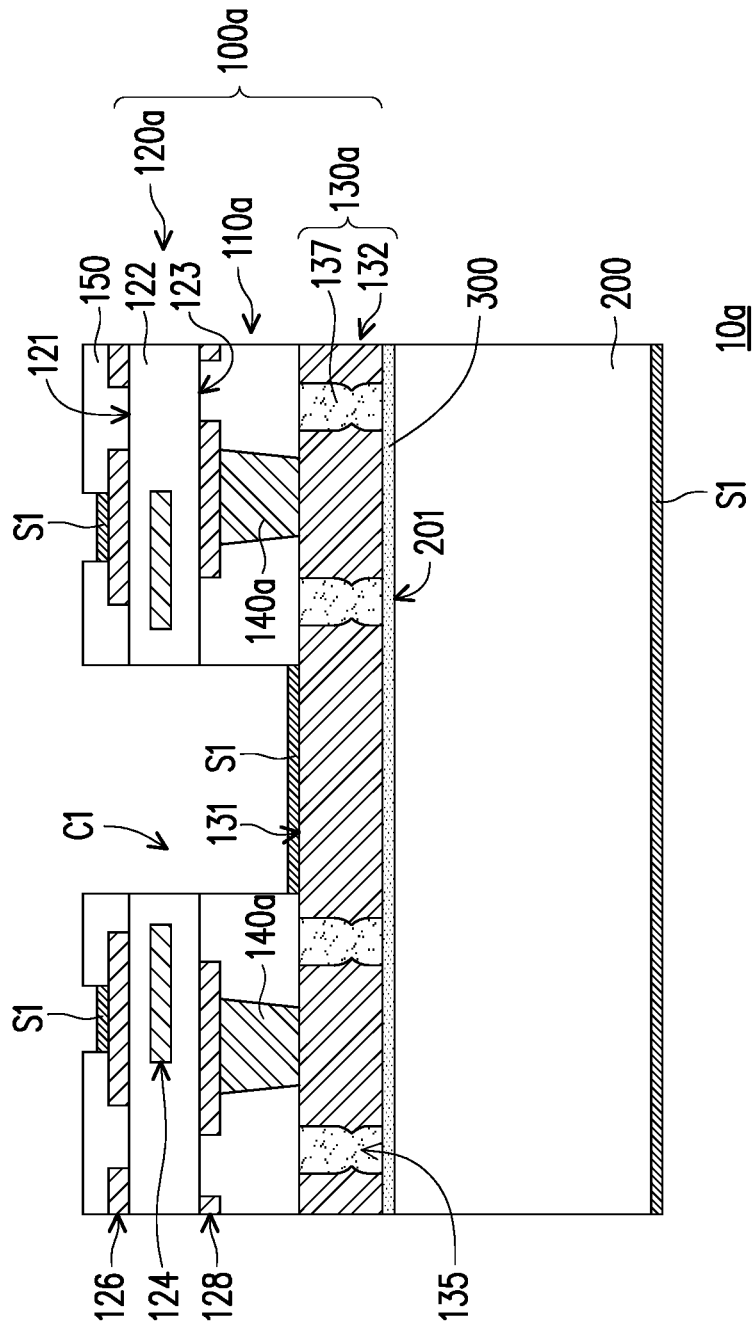

Finally, referring to FIG. 1F, a surface treatment layer S1 is formed on the first conductive member (that is, the circuit layer 126) exposed by the solder mask layer 150 and the upper surface 131 of the second conductive member (that is, the metal plate 132) exposed by the cavity C1. Here, if the material of the thermally conductive substrate 200 is metal, the surface treatment layer S1 may be selectively formed on a surface 201 of the thermally conductive substrate 200 relatively far away from the composite structure layer 100a to protect and prevent the surface 201 of the thermally conductive substrate 200 from being affected by water and oxygen. In an embodiment, the material of the surface treatment layer S1 is, for example, electroless nickel electroless palladium immersion gold (ENEPIG), electroless nickel immersion gold (ENIG) or organic solderability preservatives (OSP). At this point, the manufacture of the circuit board 10a is completed.

In terms of structure, referring to FIG. 1F again, the circuit board 10a of this embodiment includes the composite structure layer 100a, the conductive structure 140a, the thermally conductive substrate 200, and the thermal interface material layer 300. The composite structure layer 100a has the cavity C1 and includes the first structure layer 120a, the second structure layer 130a, and the connecting structure layer 110a, wherein the connecting structure layer 110a connects the first structure layer 120a and the second structure layer 130a. The first structure layer 120a includes the first conductive member (that is, the multiple circuit layers 124, 126, and 128) and the insulating layer 122, wherein the multiple circuit layers 124, 126, and 128 are disposed in the insulating layer 122 and on two opposite surfaces 121 and 123 of the insulating layer 122. The second structure layer 130a includes the second conductive member (that is, the metal plate 132) and the insulating resin 137, wherein the metal plate 132 has the opening 135 and the insulating resin 137 fills the opening 135. The conductive structure 140a penetrates the connecting structure layer 110a and is structurally and electrically connected to the first conductive member (that is, the circuit layer 128, which may be regarded as a bottom circuit layer) of the first structure layer 120a and the second conductive member (that is, the metal plate 132) of the second structure layer 130a.

Furthermore, the circuit board 10a of this embodiment further includes the solder mask layer 150 disposed on the first structure layer 120a and exposes a part of the first conductive member (that is, the circuit layer 126, which may be regarded as a top circuit layer). The cavity C1 passes through the solder mask layer 150, the first structure layer 120a, and the connecting structure layer 110a to expose the upper surface 131 of the second conductive member (that is, the metal plate 132) of the second structure layer 130a. The thermally conductive substrate 200 is disposed on one side of the composite structure layer 100a. The thermal interface material layer 300 is disposed between the composite structure layer 100a and the thermally conductive substrate 200, wherein the second structure layer 130a is connected to the thermally conductive substrate 200 through the thermal interface material layer 300. In addition, the circuit board 10a of this embodiment further includes the surface treatment layer S1 disposed on the first conductive member (that is, the circuit layer 126) exposed by the solder mask layer 150 and the upper surface 131 of the second conductive member (that is, the metal plate 132) exposed by the cavity C1. Here, the surface treatment layer S1 is further disposed on the surface 201 of the thermally conductive substrate 200 relatively far away from the composite structure layer 100a.

In short, the composite structure layer 100a of this embodiment includes the first structure layer 120a, the second structure layer 130a, and the connecting structure layer 110a, wherein the first structure layer 120a and the second structure layer 130a respectively include the conductive members (that is, the multiple circuit layers 124, 126, and 128, and the metal plate 132), and the conductive structure 140a connects the conductive members of the first structure layer 120a and the second structure layer 130a, and the second structure layer 130a of the composite structure layer 100a is connected to the thermally conductive substrate 200 through the thermal interface material layer 300. In this way, the circuit board 10a of this embodiment not only can dissipate heat through the thermally conductive substrate 200 and the metal plate 132 but also has at least two layers of conductive members (for example, the multiple circuit layers 124, 126, and 128) for use.

It should be noted here that the following embodiments use the reference numerals and a part of the content of the foregoing embodiments, wherein the same reference numerals are used to represent the same or similar elements, and the description of the same technical content is omitted. Please refer to the foregoing embodiments for the description of the omitted part, which will not be repeated in the following embodiments.

FIG. 2A to FIG. 2G are schematic cross-sectional views showing a manufacturing method of a circuit board according to another embodiment of the disclosure. FIG. 2H to FIG. 2J are schematic cross-sectional views respectively showing at least one electronic component disposed on the circuit board of FIG. 2G. First, referring to FIG. 1C and FIG. 2D, the manufacturing method of the circuit board 10b (referring to FIG. 2G) of this embodiment is similar to the manufacturing method of the circuit board 10a (referring to FIG. 1F) described above, and the difference between the two circuit boards is that a first structure layer 120b and a second structure layer 130b of a composite structure layer 100b' of this embodiment are different from the first structure layer 120a and the second structure layer 130a of the composite structure layer 100a described above.

Figure 2A:
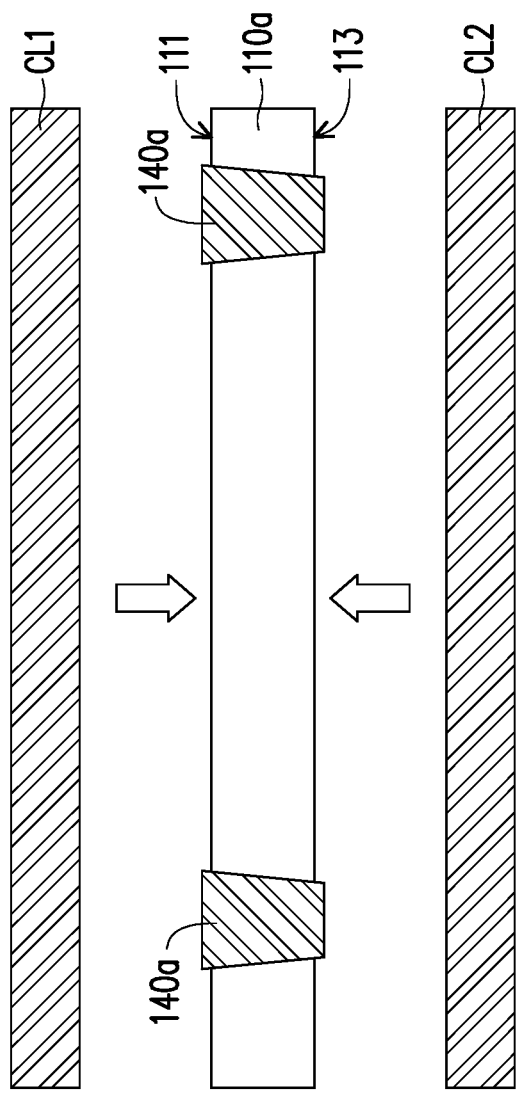
FIG. 2A to FIG. 2G are schematic cross-sectional views showing a manufacturing method of a circuit board according to another embodiment of the disclosure.

In detail, referring to FIG. 2A, a first conductive layer CL1 and a second conductive layer CL2 are provided, wherein the first conductive layer CL1 and the second conductive layer CL2 are respectively copper foils, for example, and the thickness thereof is 210 micrometers to 525 micrometers. Next, a connecting structure layer 110a is provided between the first conductive layer CL1 and the second conductive layer CL2, wherein a conductive structure 140a passes through the connecting structure layer 110a and protrudes from two opposite surfaces 111 and 113 of the connecting structure layer 110a, and the connecting structure layer 110a is in a B-stage state.

Figure 2B:
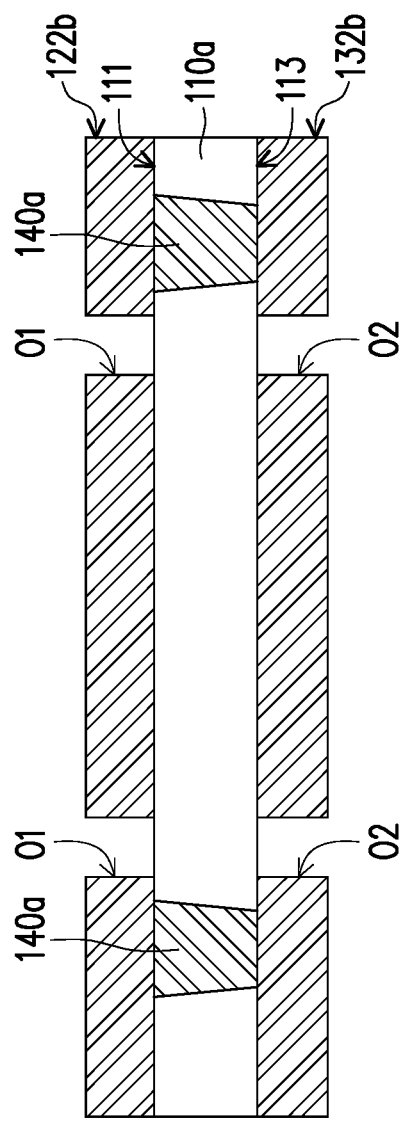

Next, referring to FIG. 2A and FIG. 2B, the first conductive layer CL1, the connecting structure layer 110a, and the second conductive layer CL2 are compressed by a hot pressing method, so that the conductive structure 140a is connected to the first conductive layer CL1 and the second conductive layer CL2, and the connecting structure layer 110a changes from the B-stage state to a C-stage state. Then, the first conductive layer CL1 and the second conductive layer CL2 are patterned to form a first circuit layer 122b having a plurality of first openings O1 and a second circuit layer 132b having a plurality of second openings O2. That is, the first conductive member of this embodiment is substantially the first circuit layer 122b, and the second conductive member is substantially the second circuit layer 132b. Here, the first opening O1 and the second opening O2 respectively expose a part of the surfaces 111 and 113 of the connecting structure layer 110a. The conductive structure 140a structurally and electrically connects the first circuit layer 122b and the second circuit layer 132b.

Figure 2C:
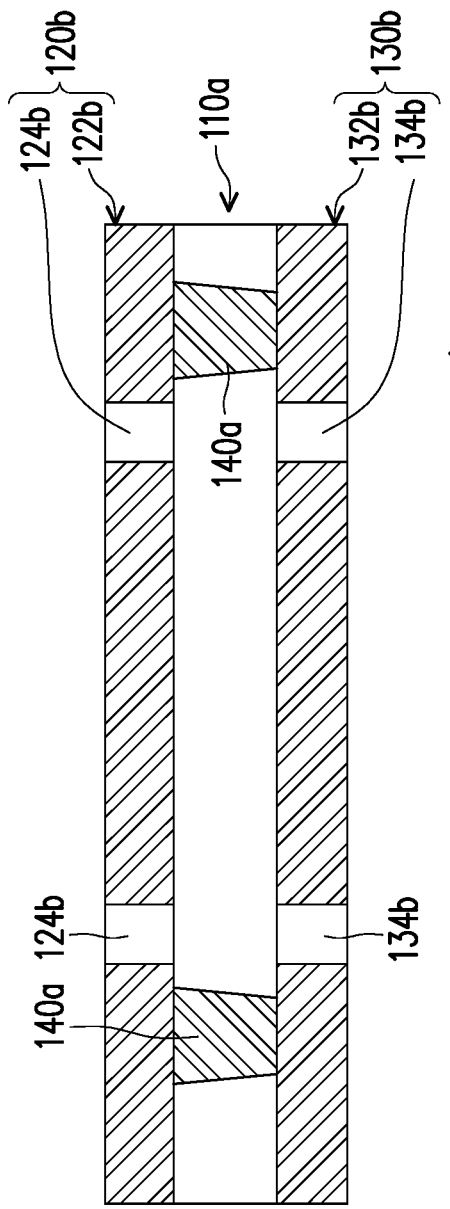

Next, referring to FIG. 2C, a first insulating layer 124b is formed in the first opening O1 and a second insulating layer 134b is formed in the second opening O2. At this time, the first insulating layer 124b is flush with the first circuit layer 122b, and defines the first structure layer 120b with the first circuit layer 122b. The second insulating layer 134b is flush with the second circuit layer 132b, and defines the second structure layer 130b with the second circuit layer 132b. At this point, the manufacture of the composite structure layer 100b' is completed.

Figure 2D:
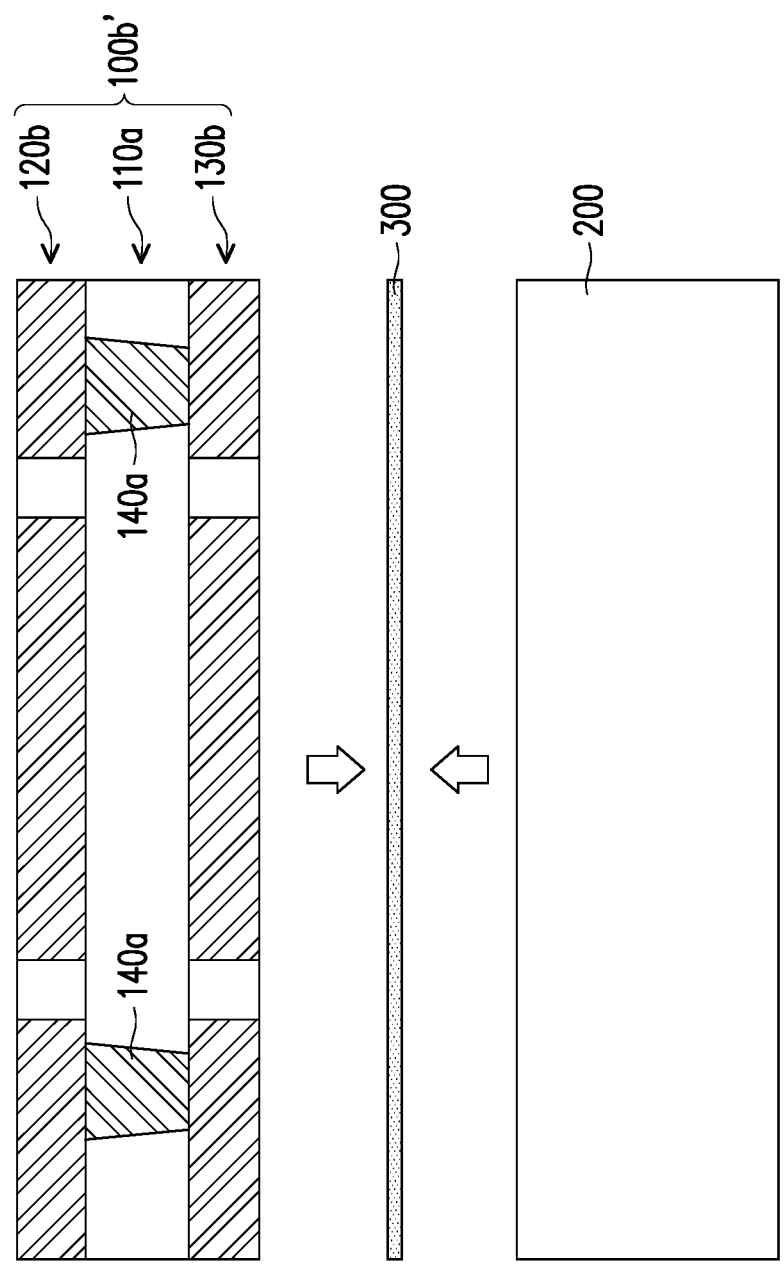
Figure 2E:
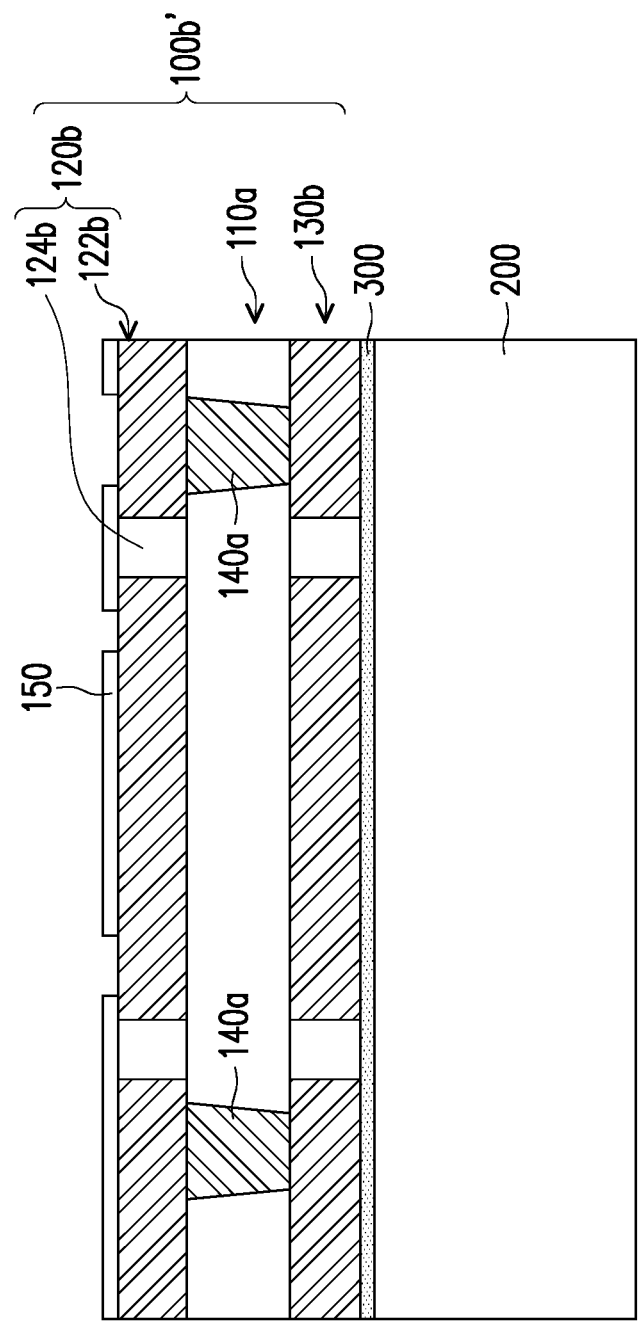
Figure 2F:
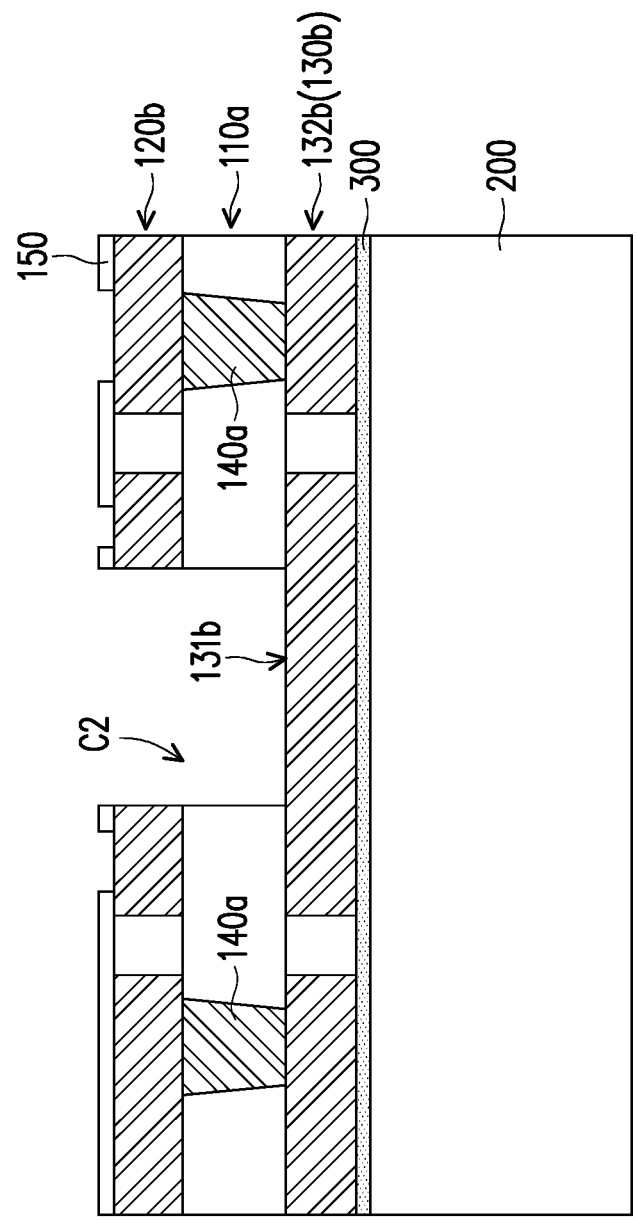

Next, referring to FIG. 2D, a thermally conductive substrate 200 and a thermal interface material layer 300 are provided, wherein the thermal interface material layer 300 is located between the composite structure layer 100b' and the thermally conductive substrate 200. Next, referring to FIG. 2D and FIG. 2E, the composite structure layer 100b', the thermal interface material layer 300, and the thermally conductive substrate 200 are compressed so that the second structure layer 130b is connected to the thermally conductive substrate 200 through the thermal interface material layer 300.

Next, referring to FIG. 2E again, a solder mask layer 150 is formed on the first structure layer 120b. The solder mask layer 150 exposes a part of the first conductive member (that is, the first circuit layer 122b). Then, referring to FIG. 2F, a cavity C2 is formed to penetrate the solder mask layer 150, the first structure layer 120b, and the connecting structure layer 110a to expose an upper surface 131b of the second conductive member (that is, the second circuit layer 132b) of the second structure layer 130b.

Figure 2G:
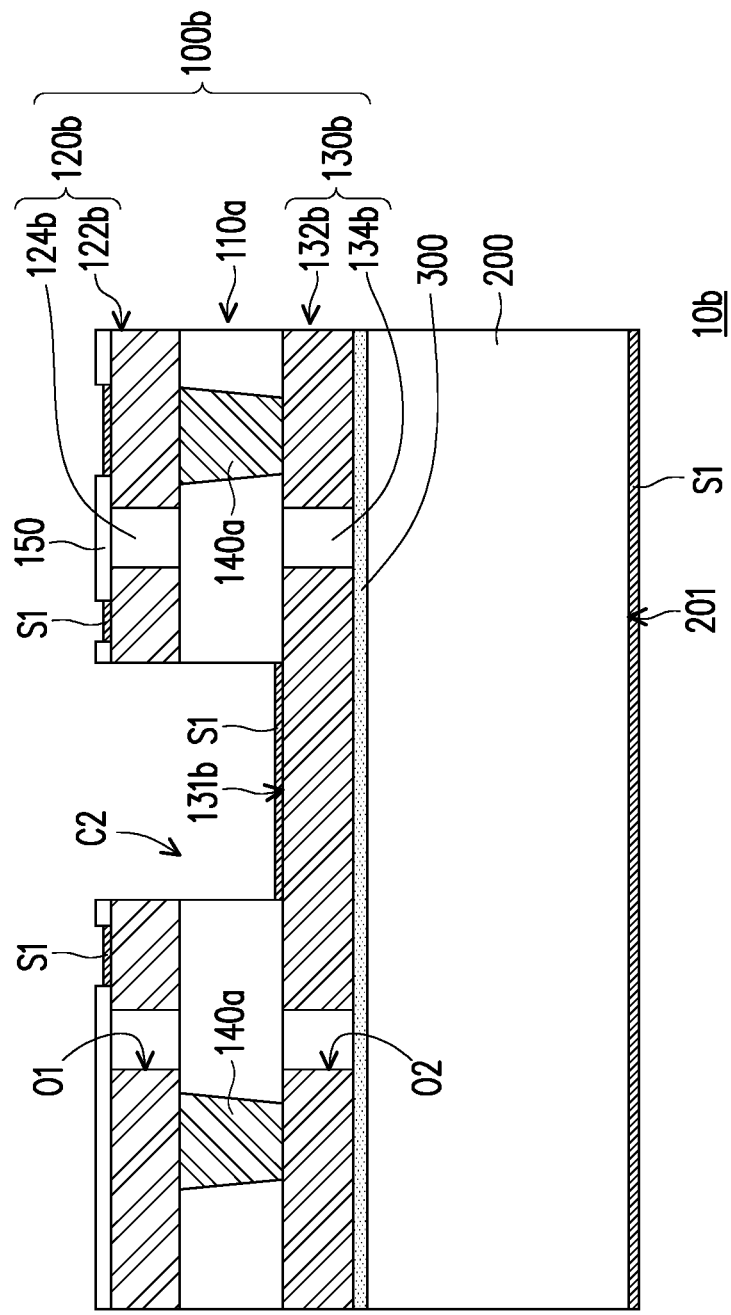
Figure 2H:
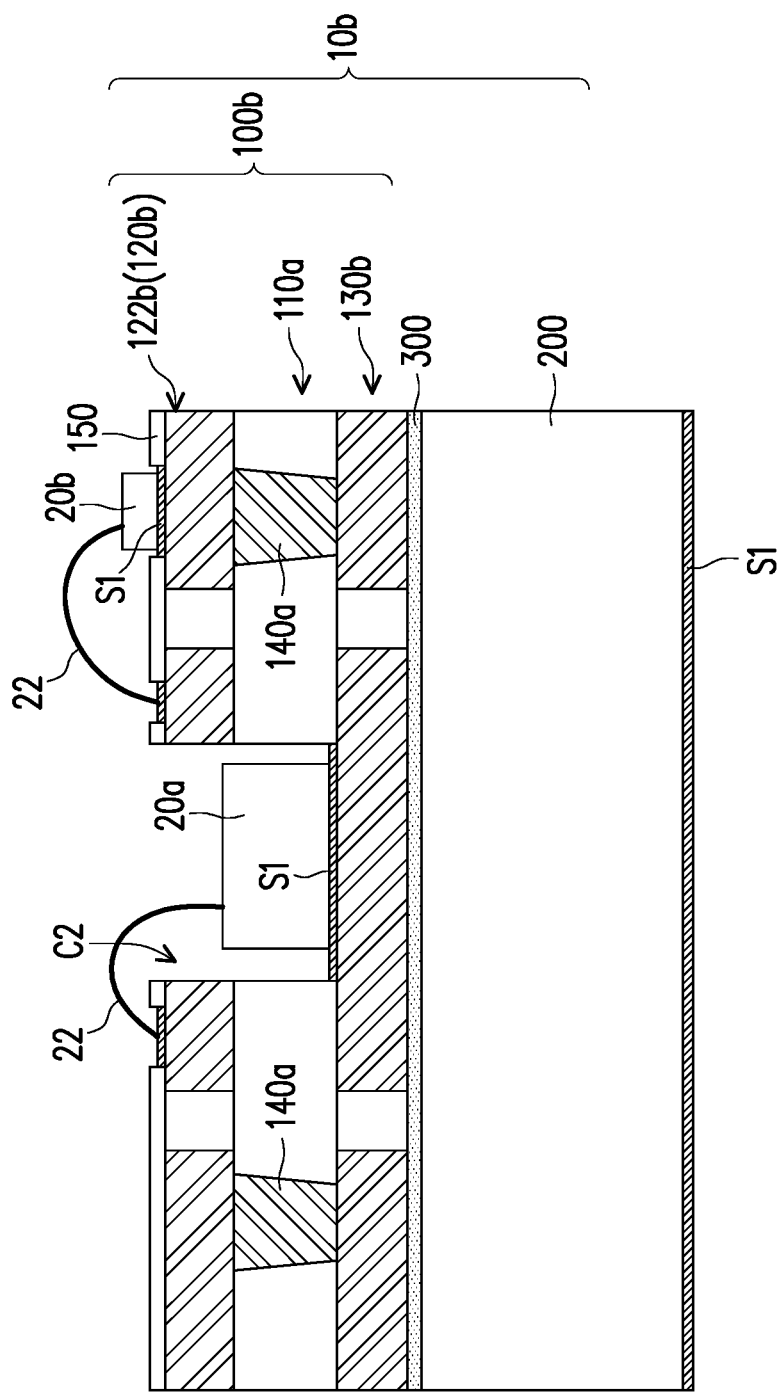
FIG. 2H to FIG. 2J are schematic cross-sectional views respectively showing at least one electronic component disposed on the circuit board of FIG. 2G.
Figure 2I:
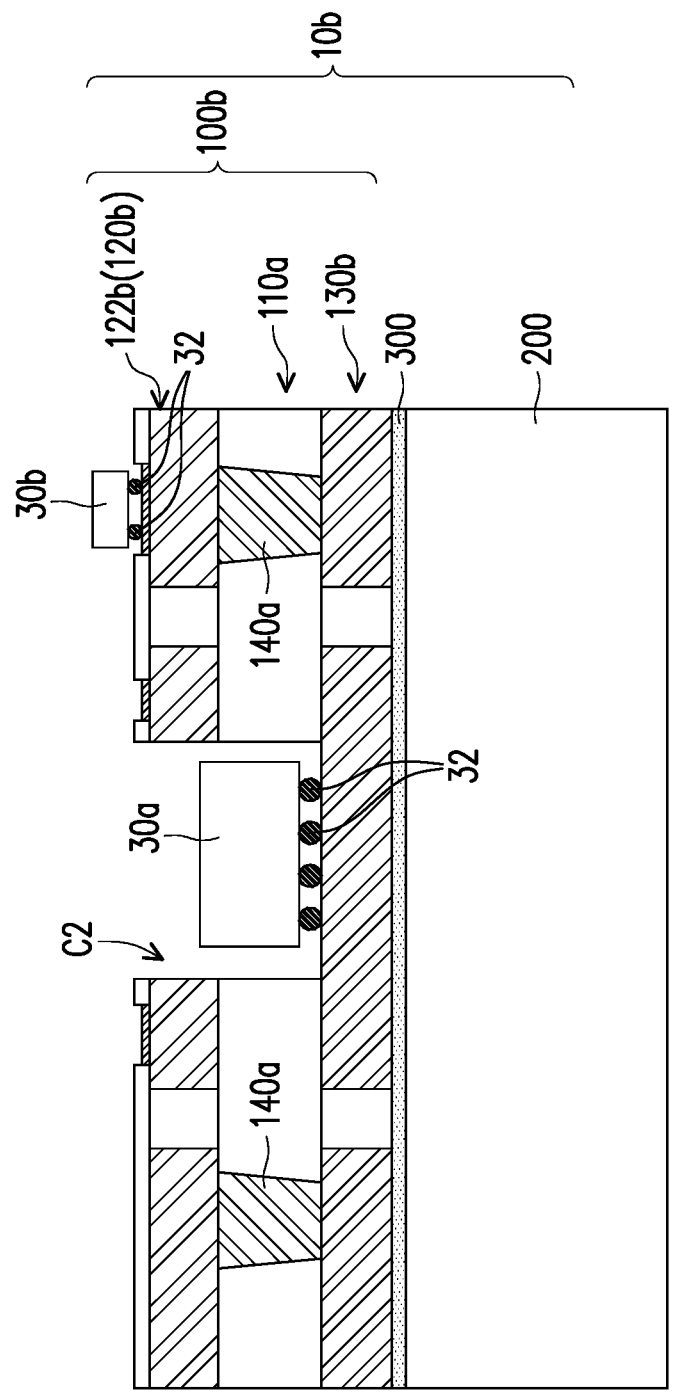
Figure 2J:
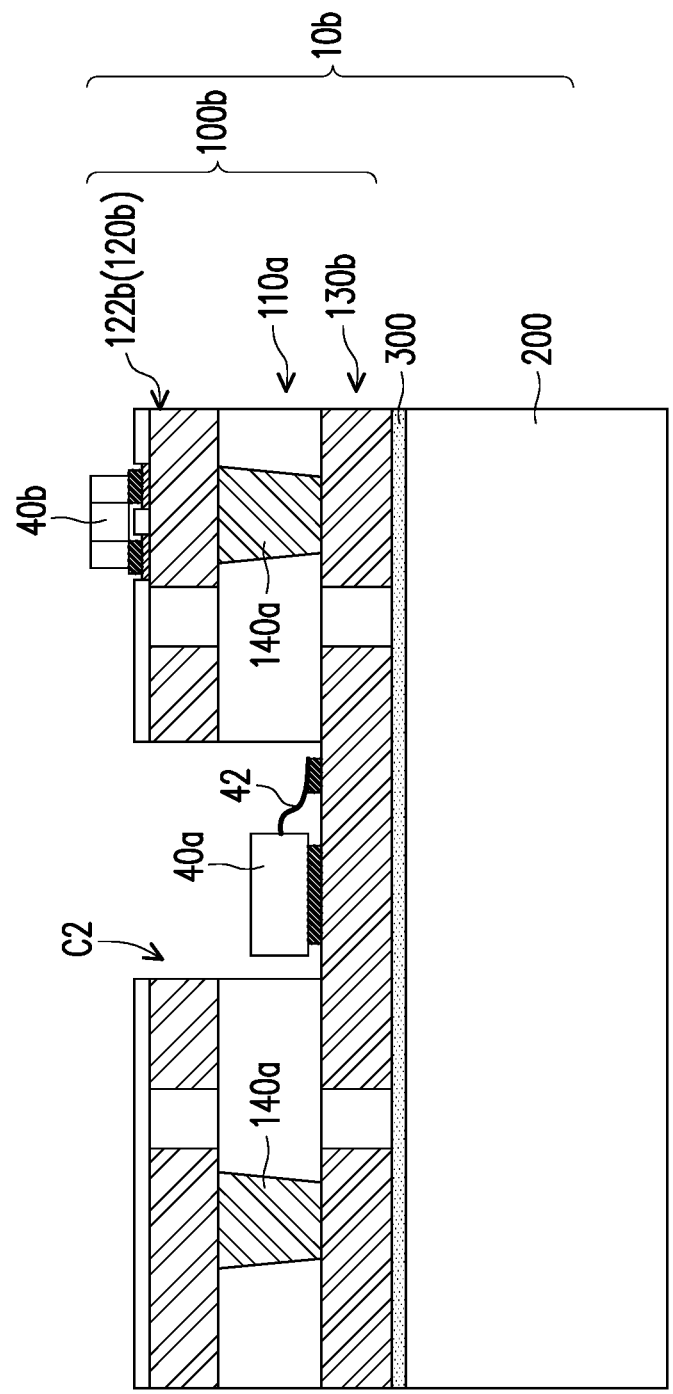

Finally, referring to FIG. 2G, a surface treatment layer S1 is formed on the first conductive member (that is, the first circuit layer 122b) exposed by the solder mask layer 150 and the upper surface 131*b* of the second conductive member (that is, the second circuit layer 132*b*) exposed by the cavity C2. Here, if the material of the thermally conductive substrate 200 is metal, the surface treatment layer S1 may be selectively formed on a surface 201 of the thermally conductive substrate 200 relatively far away from the composite structure layer 100*b* to protect and prevent the surface 201 of the thermally conductive substrate 200 from being affected by water and oxygen. At this point, the manufacture of the circuit board 10*b* is completed.

In terms of structure, referring to FIG. 1F and FIG. 2G, the circuit board 10*b* of this embodiment is similar to the circuit board 10*a* described above, and the difference between the two circuit boards is that the first structure layer 120*b* of this embodiment is composed of the first circuit layer 122*b* and the first insulating layer 124*b*, wherein the first circuit layer 122*b* has the first opening O1, and the first insulating layer 124*b* is located in the first opening O1, and the first insulating layer 124*b* is flush with the first circuit layer 122*b*. The second structure layer 130*b* is composed of the second circuit layer 132*b* and the second insulating layer 134*b*, wherein the second circuit layer 132*b* has the second opening O2, and the second insulating layer 134*b* is located in the second opening O2, and the second insulating layer 134*b* is flush with the second circuit layer 132*b*. The conductive structure 140*a* passes through the connecting structure layer 110*a* to structurally and electrically connect the first circuit layer 122*b* of the first structure layer 120*b* and the second circuit layer 132*b* of the second structure layer 130*b*.

In terms of application, referring to FIG. 2H, at least one electronic component (two electronic components 20*a* and 20*b* are schematically shown) is disposed on the circuit board 10*b*, wherein the electronic component 20*a* is located in the cavity C2 and is disposed on the surface treatment layer S1, and the electronic component 20*b* is located on the surface treatment layer S1 on the first circuit layer 122*b* of the first structure layer 120*b* exposed by the solder mask layer 150. Here, the electronic components 20*a* and 20*b* are respectively electrically connected to the first circuit layer 122*b* by bonding wires 22, and the electronic components 20*a* and 20*b* are, for example, unpackaged dies. In another embodiment, referring to FIG. 2I, the electronic components 30*a* and 30*b* are respectively electrically connected to the first circuit layer 122*b* by solder balls 32. That is, the electronic components 30*a* and 30*b* are electrically connected to the circuit board 10*b* in a flip chip manner. In yet another embodiment, referring to FIG. 2J, the electronic components 40*a* and 40*b* are electrically connected to the first circuit layer 122*b* by surface mounting technology (SMT), wherein the electronic component 40*a* is electrically connected to the first circuit layer 122*b* by a lead pin 42. That is, the electronic components 40*a* and 40*b* are embodied as a package.

Since the electronic components 20*a*, 30*a*, and 40*a* are located in the cavity C2, the heat generated may be quickly transmitted to the outside through the surface treatment layer S1, the second circuit layer 132*b* of the second structure layer 130*b*, the thermal interface material layer 300, and the thermally conductive substrate 200 directly. In addition, since the circuit board 10*b* having the thermally conductive substrate 200 of this embodiment has at least two layers of circuit layers (that is, the first circuit layer 122*b* and the second circuit layer 132*b*), the circuit board 10*b* has the electronic components 20*a*, 20*b*, 30*a*, 30*b*, 40*a*, and 40*b* for use after being assembled, and has good flexibility in use.

Figure 3C:
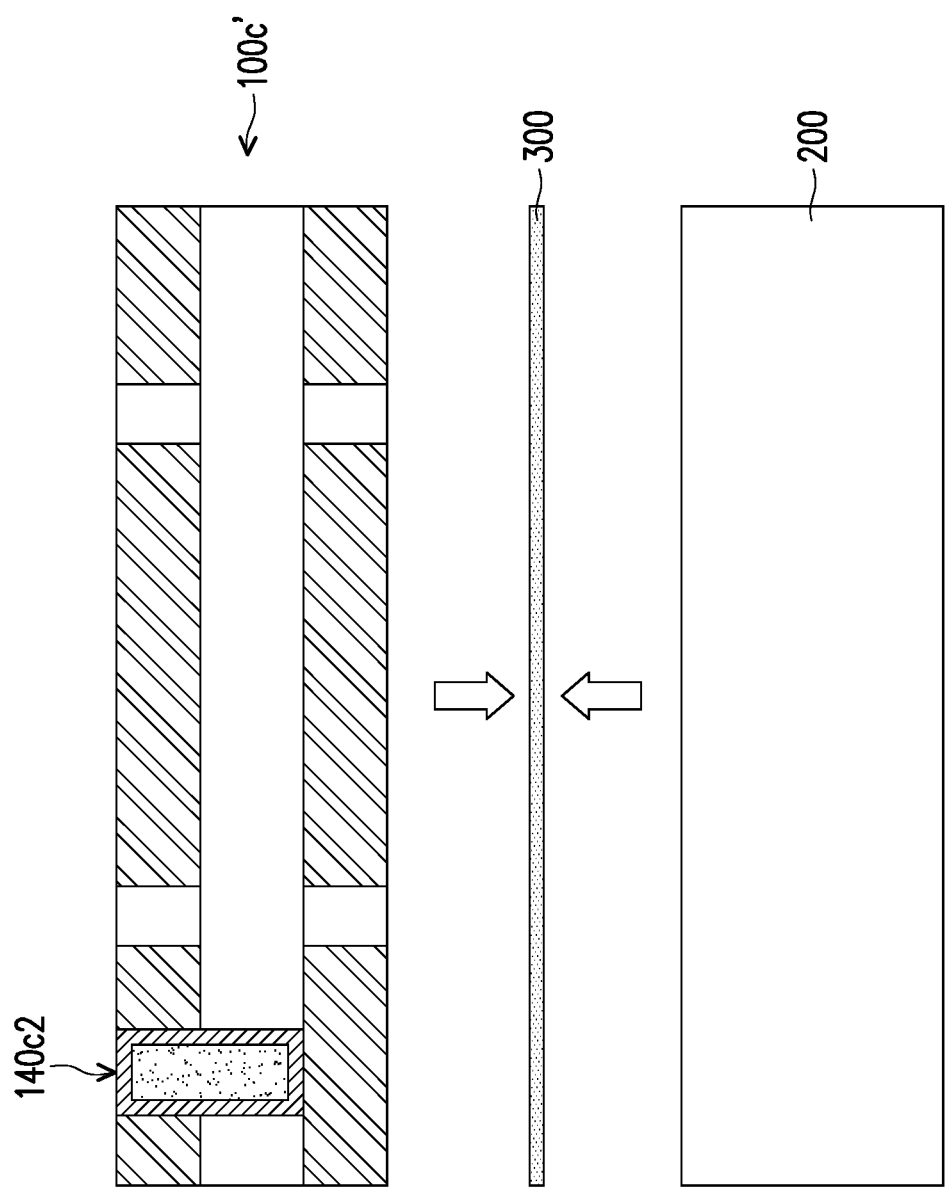
Figure 3D:
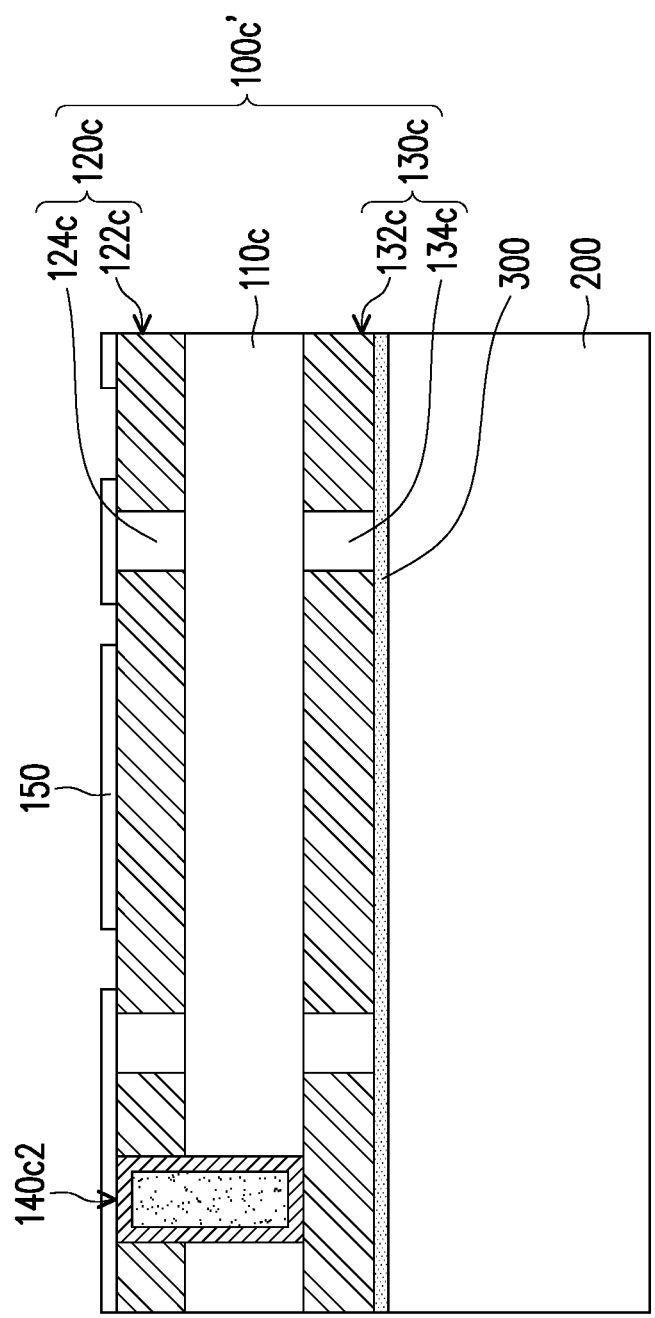
Figure 3E:
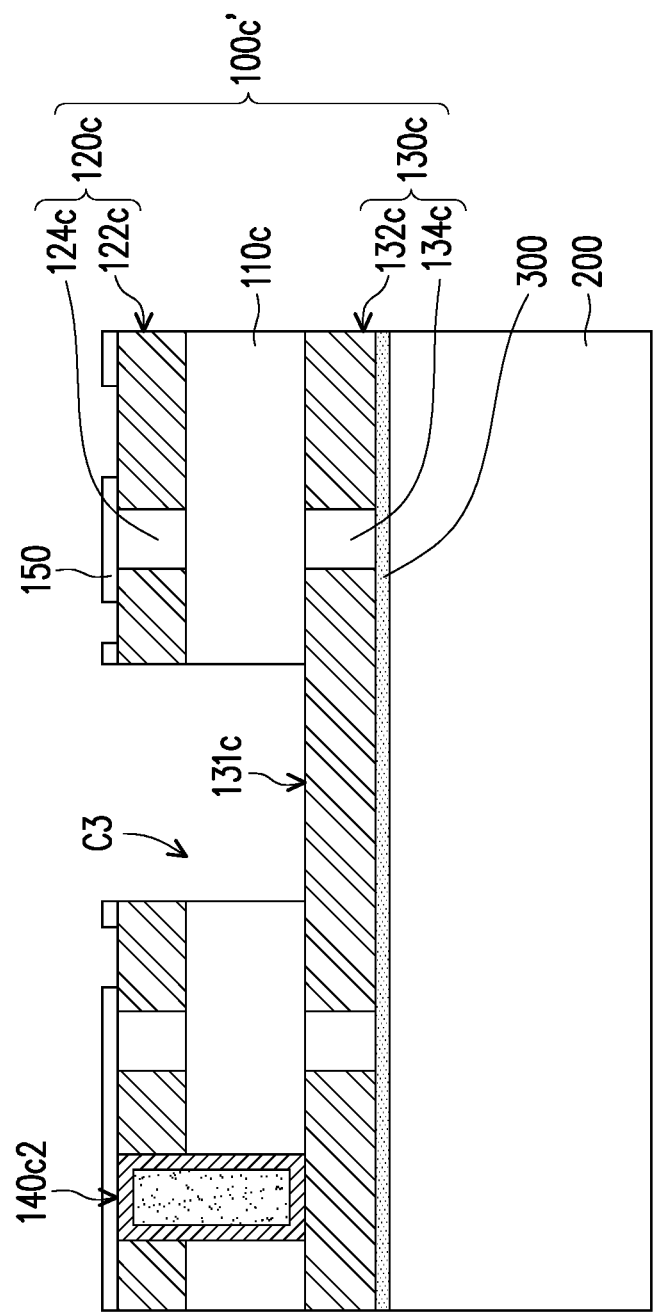

FIG. 3A is a schematic cross-sectional view of a composite structure layer and a conductive structure according to an embodiment of the disclosure. FIG. 3B to FIG. 3F are schematic cross-sectional views showing some steps of a manufacturing method of a circuit board according to another embodiment of the disclosure. First, referring to FIG. 2C and FIG. 3A, a composite structure layer 100*c'* and a conductive structure 140*c*1 of this embodiment have a similar configuration to the composite structure layer 100*b'* and the conductive structure 140*a* described above, and the difference between the two configurations is that in this embodiment, the conductive structure 140*c*1 is formed to pass through the first conductive layer CL1 and the connecting structure layer 110*c* after the first conductive layer CL1 (referring to FIG. 2A), the connecting structure layer 110*c*, and the second conductive layer CL2 (referring to FIG. 2A) are compressed, wherein the conductive structure 140*c*1 is electrically connected to the first conductive layer CL1 and the second conductive layer CL2. Here, the conductive structure 140*c*1 is, for example, formed by first performing laser or mechanical drilling, and then filling in conductive glue or electroplating metal, wherein the conductive glue is copper paste, for example, and the electroplating metal is copper, for example. Next, same as the steps of FIG. 2B and FIG. 2C, the first conductive layer CL1 and the second conductive layer CL2 are patterned to form a first circuit layer 122*c* having first openings O1 and a second circuit layer 132*c* having second openings O2. Then, a first insulating layer 124*c* is formed in the first opening O1 and a second insulating layer 134*c* is formed in the second opening O2. The first insulating layer 124*c* is flush with the first circuit layer 122*c*, and defines a first structure layer 120*c* with the first circuit layer 122*c*. The second insulating layer 134*c* is flush with the second circuit layer 132*c*, and defines a second structure layer 130*c* with the second circuit layer 132*c*. At this point, the manufacture of the composite structure layer 100*c'* and the conductive structure 140*c*1 is completed.

In another embodiment, first, referring to FIG. 3A and FIG. 3B, a conductive structure 140*c*2 of this embodiment is similar to the conductive structure 140*c*1 described above, and the difference between the two conductive structures is that the conductive structure 140*c*2 of this embodiment includes an electroplated metal layer 144*c* and a resin layer 142*c*. The resin layer 142*c* penetrates the first circuit layer 122*c* of the first structure layer 120*c* and the connecting structure layer 110*c*, and the electroplated metal layer 144*c* covers all surfaces of the resin layer 142*c*.

In the manufacture of the circuit board 10*c* (referring to FIG. 3F), then, referring to FIG. 3C, a thermally conductive substrate 200 and a thermal interface material layer 300 are provided, wherein the thermal interface material layer 300 is located between a composite structure layer 100*c'* and the thermally conductive substrate 200. Next, referring to FIG. 3C and FIG. 3D, the composite structure layer 100*c'*, the thermal interface material layer 300, and the thermally conductive substrate 200 are compressed so that the second structure layer 130*c* is connected to the thermally conductive substrate 200 through the thermal interface material layer 300.

Next, referring to FIG. 3D again, a solder mask layer 150 is formed on the first structure layer 120*c* and the conductive structure 140*c*2. The solder mask layer 150 exposes a part of the first conductive member (that is, the first circuit layer 122*c*). Then, referring to FIG. 3E, a cavity C3 is formed to penetrate the solder mask layer 150, the first structure layer 120*c* of the composite structure layer 100*c'*, and the connecting structure layer 110c to expose an upper surface 131c of the second conductive member (that is, the second circuit layer 132c) of the second structure layer 130c.

Figure 3F:
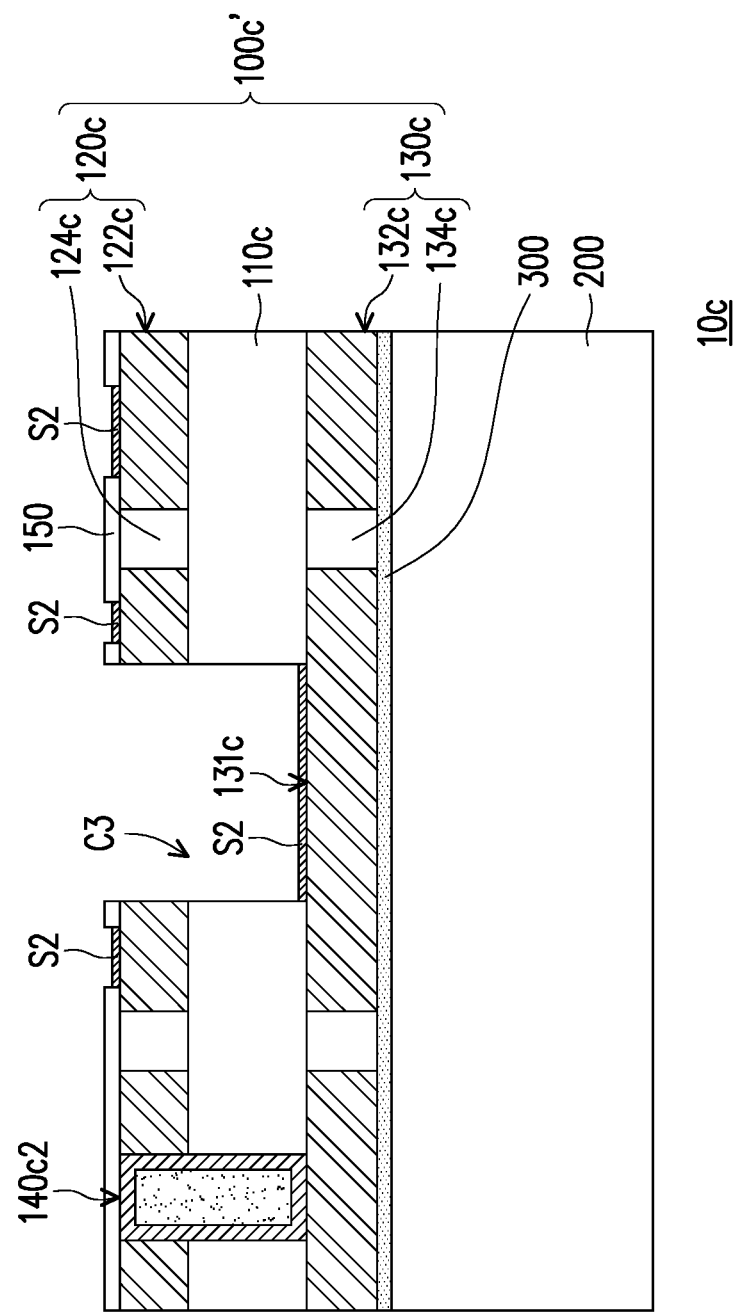

Finally, referring to FIG. 3F, a surface treatment layer S2 is formed on the first conductive member (that is, the first circuit layer 122c) exposed by the solder mask layer 150 and the upper surface 131c of the second conductive member (that is, the second circuit layer 132c) exposed by the cavity C3. At this point, the manufacture of the circuit board 10c is completed.

In terms of structure, referring to FIG. 2G and FIG. 3F, the circuit board 10c of this embodiment is similar to the circuit board 10b described above, and the difference between the two circuit boards is that in this embodiment, the conductive structure 140c2 further passes through the first circuit layer 122c of the first structure layer 120c, and the conductive structure 140c2 has a different structure from the conductive structure 140a. In detail, referring to FIG. 3B, the conductive structure 140c2 of this embodiment includes an electroplated metal layer 144c and a resin layer 142c. The resin layer 142c penetrates the first circuit layer 122c of the first structure layer 120c and the connecting structure layer 110c, and the electroplated metal layer 144c covers all surfaces of the resin layer 142c.

FIG. 4A to FIG. 4D are schematic cross-sectional views showing a manufacturing method of a circuit board according to another embodiment of the disclosure. First, referring to FIG. 3B and FIG. 4A, the manufacturing method of the circuit board 10d (referring to FIG. 4D) of this embodiment is similar to the manufacturing method of the circuit board 10c (referring to FIG. 3F) described above, and the difference between the two manufacturing methods is that the manufacture of a conductive structure 140d of this embodiment is different from the manufacture of the conductive structure 140c2 described above. In detail, the conductive structure 140d of this embodiment is formed after a composite structure layer 100d' (referring to FIG. 4A), a thermal interface material layer 300, and a thermally conductive substrate 200 are compressed. The conductive structure 140d of this embodiment passes through a first circuit layer 122d of a first structure layer 120d of the composite structure layer 100d', a connecting structure layer 110d, a second circuit layer 132d of a second structure layer 130d, the thermal interface material layer 300 and a part of the thermally conductive substrate 200. Furthermore, the conductive structure 140d includes an electroplated metal layer 144d and a resin layer 142d. The resin layer 142d penetrates the first circuit layer 122d of the first structure layer 120d, the connecting structure layer 110d, the second circuit layer 132d of the second structure layer 130d, the thermal interface material layer 300, and a part of the thermally conductive substrate 200, and the electroplated metal layer 144d covers all surfaces of the resin layer 142d.

Next, referring to FIG. 4B again, a solder mask layer 150 is formed on a part of the first circuit layer 122d and the first insulating layer 124d of the first structure layer 120d and on the conductive structure 140d. The solder mask layer 150 exposes a part of the first conductive member (that is, the first circuit layer 122d). Then, referring to FIG. 4C, a cavity C4 is formed to penetrate the solder mask layer 150, the first structure layer 120d, and the connecting structure layer 110d to expose an upper surface 131d of the second conductive member (that is, the second circuit layer 132d) of the second structure layer 130d. In other words, a second insulating layer 134d of the second structure layer 130d is not exposed by the cavity C4.

Figure 4A:
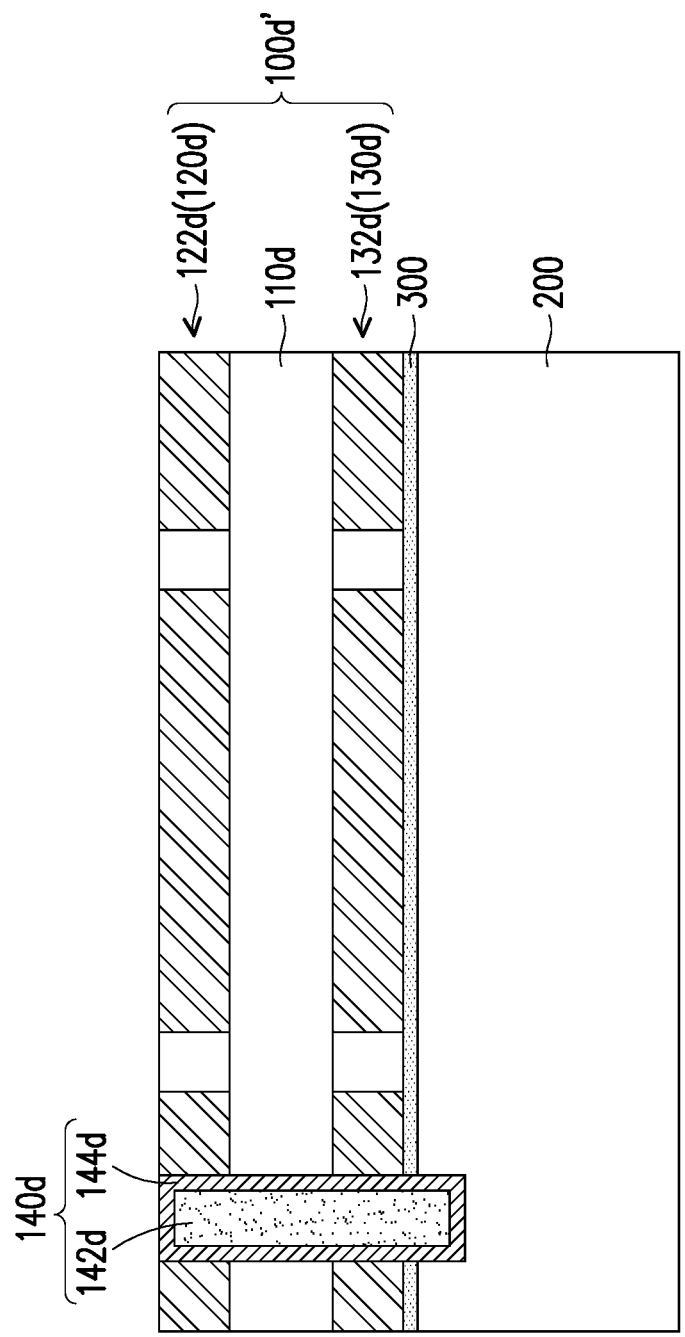
FIG. 4A to FIG. 4D are schematic cross-sectional views showing a manufacturing method of a circuit board according to another embodiment of the disclosure.
Figure 4B:
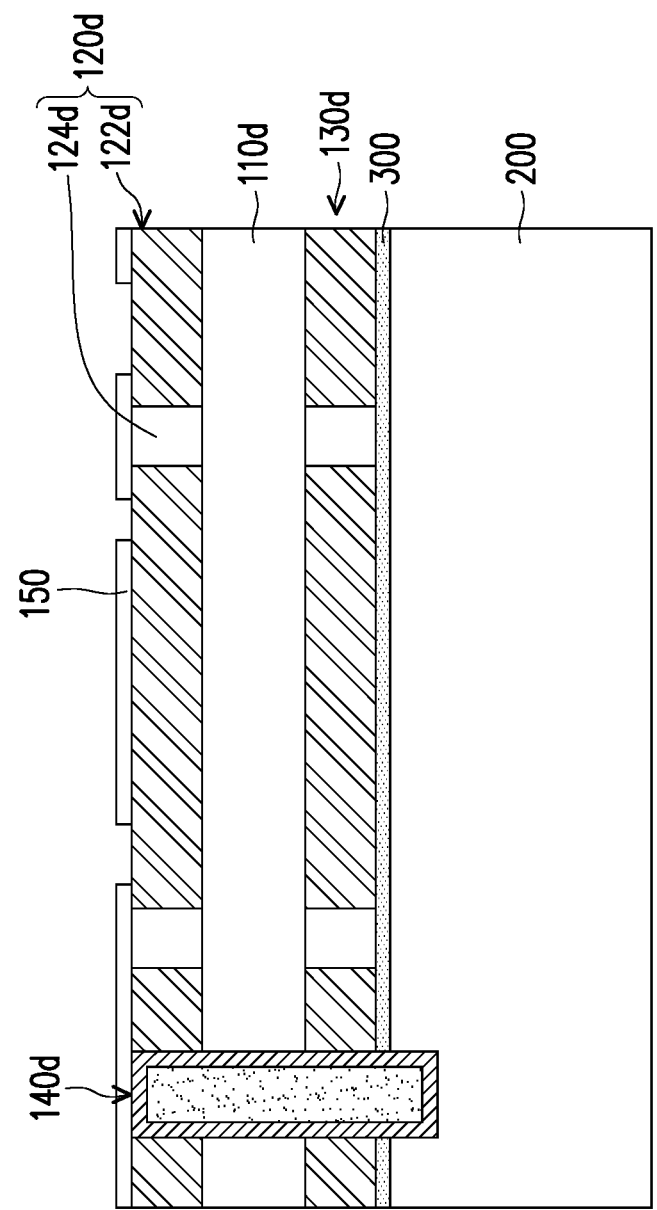
Figure 4C:
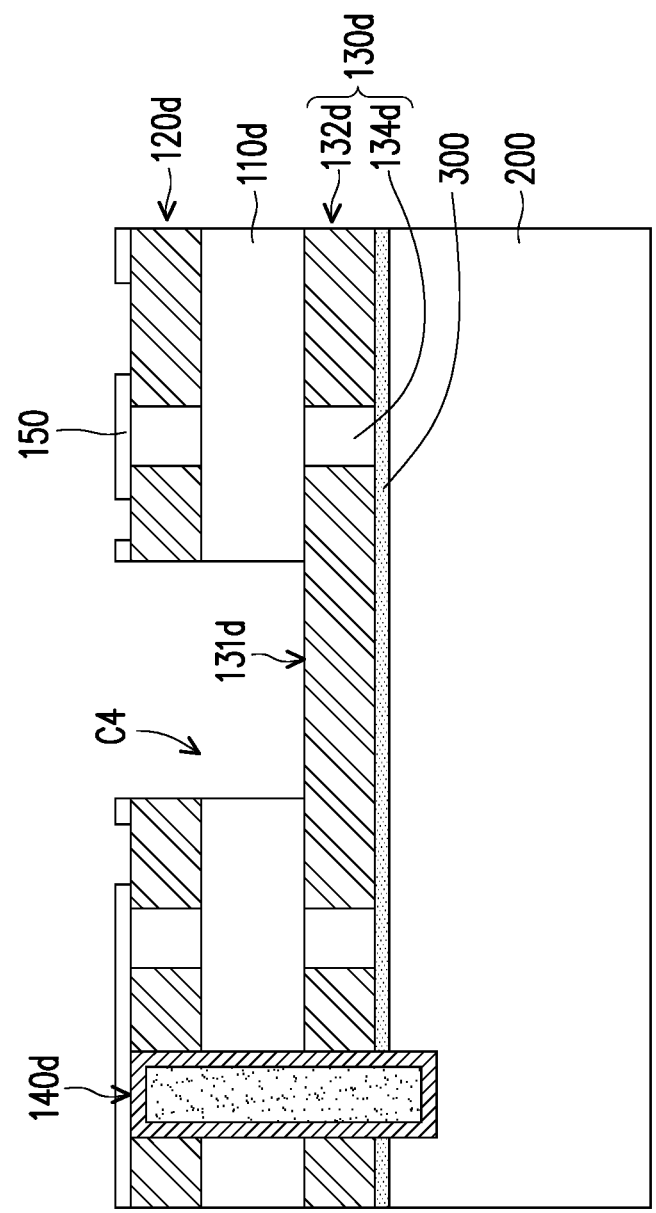
Figure 4D:
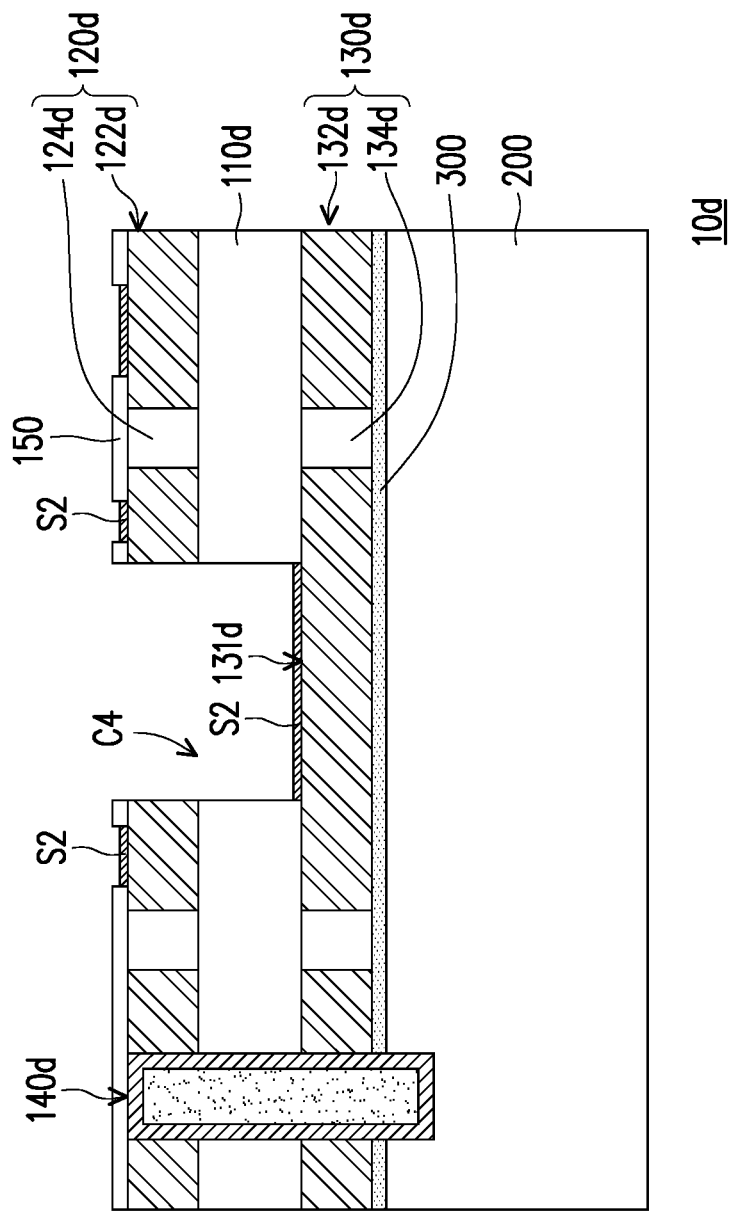

Finally, referring to FIG. 4D, a surface treatment layer S2 is formed on the first conductive member (that is, the first circuit layer 122d) exposed by the solder mask layer 150 and the upper surface 131d of the second conductive member (that is, the second circuit layer 132d) exposed by the cavity C4. At this point, the manufacture of the circuit board 10d is completed.

In terms of structure, referring to FIG. 3F and FIG. 4D, the circuit board 10d of this embodiment is similar to the circuit board 10c described above, and the difference between the two circuit boards is that in this embodiment, the conductive structure 140d passes through the first circuit layer 122d of the first structure layer 120d, the connecting structure layer 110d, the second circuit layer 132d of the second structure layer 130d, the thermal interface material layer 300, and a part of the thermally conductive substrate 200.

FIG. 5A to FIG. 5E are schematic cross-sectional views showing some steps of a manufacturing method of a circuit board according to another embodiment of the disclosure. First, referring to FIG. 4A and FIG. 5A, the manufacturing method of a circuit board 10e (referring to FIG. 5E) of this embodiment is similar to the circuit board 10d (referring to FIG. 4D) described above, and the difference between the two manufacturing methods is that after the step of FIG. 4A, the conductive structure 140d located in the first structure layer 120d and the connecting structure layer 110d (referring to FIG. 4A) is removed to form a hole T and a conductive structure 140e.

Figure 5A:
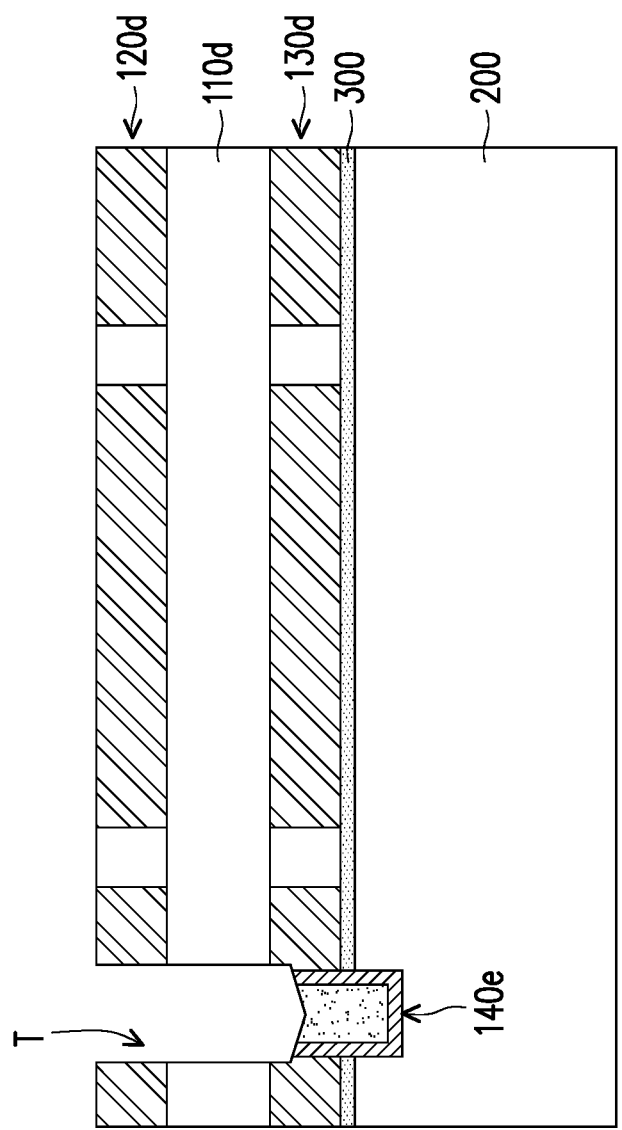
FIG. 5A to FIG. 5E are schematic cross-sectional views showing some steps of a manufacturing method of a circuit board according to another embodiment of the disclosure.
Figure 5B:
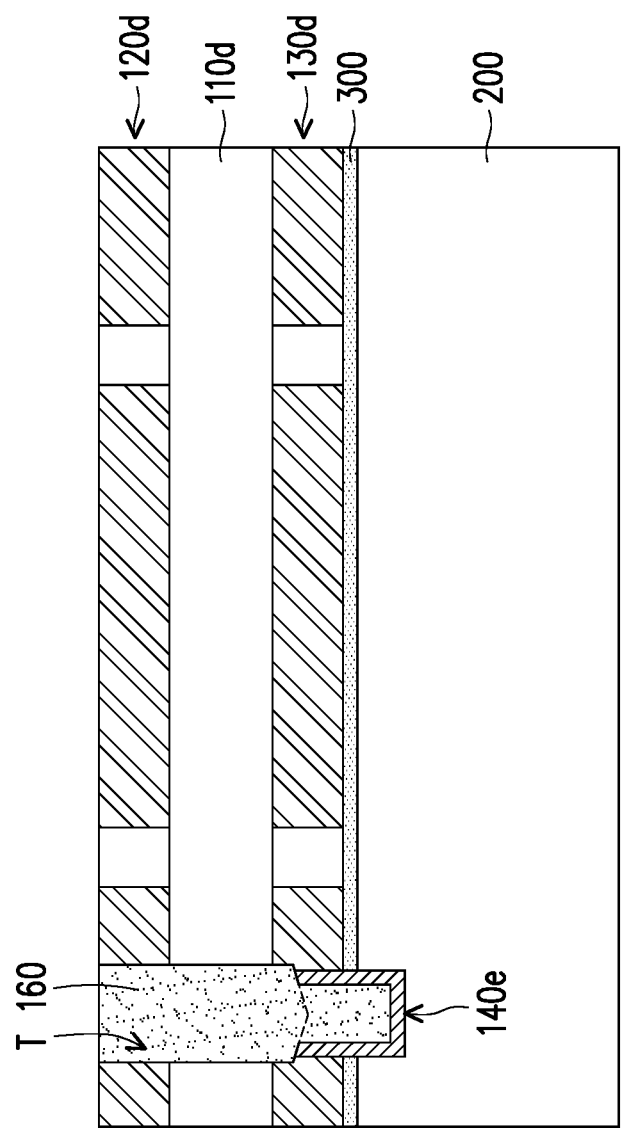
Figure 5C:
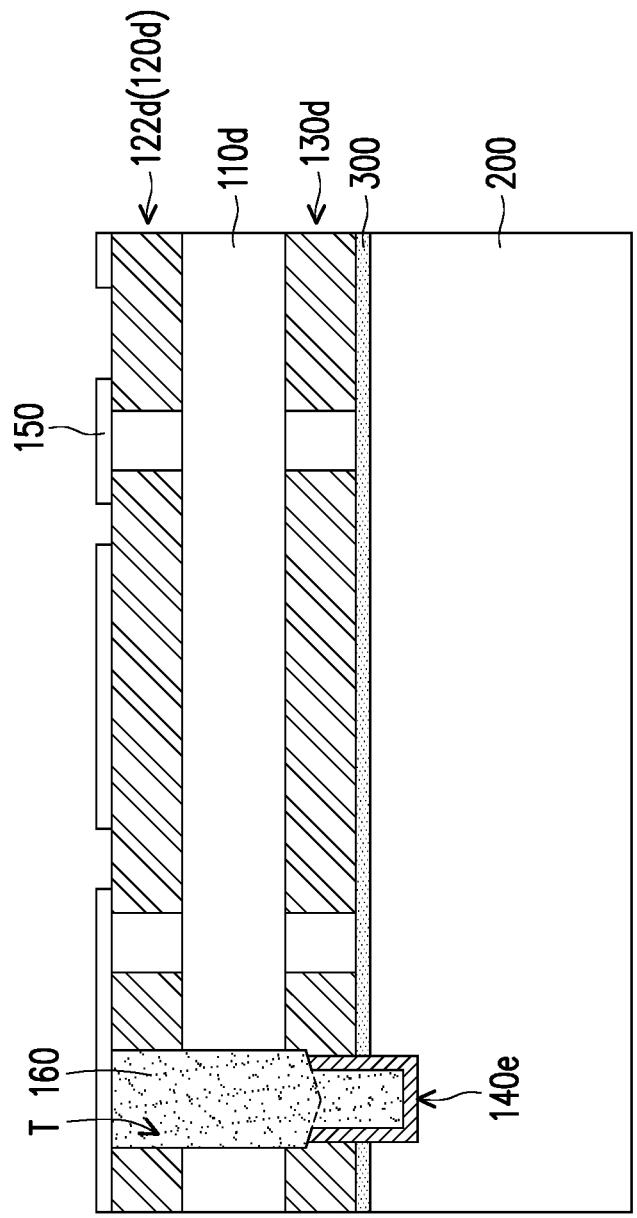
Figure 5D:
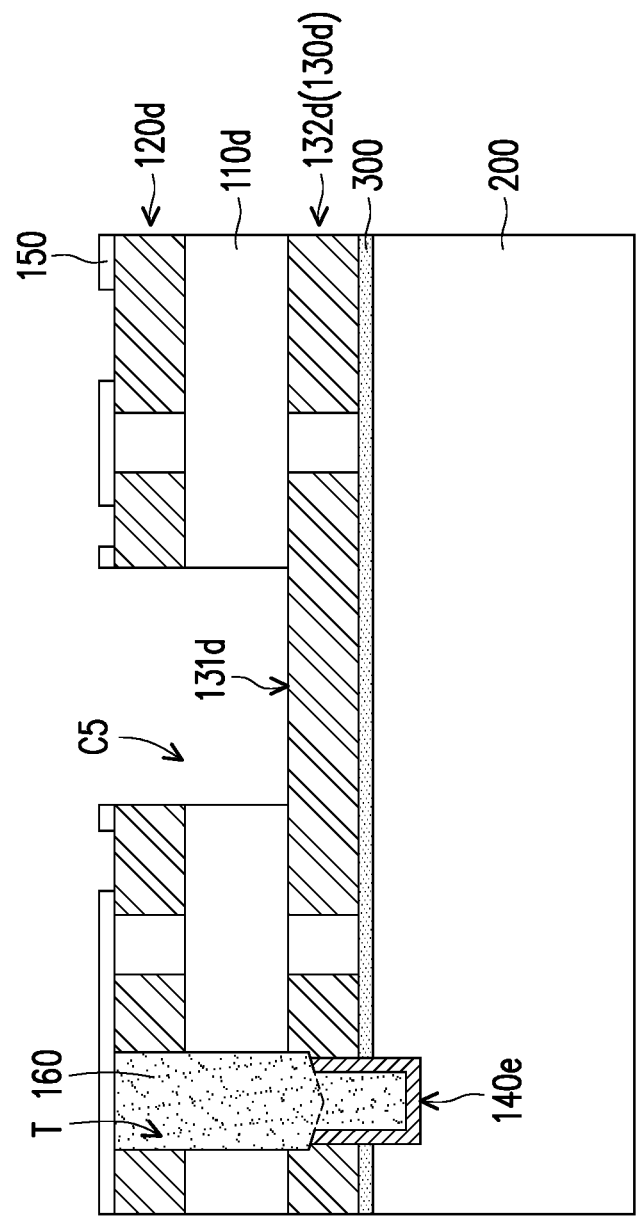

Next, referring to FIG. 5B, a resin layer 160 is filled in the hole T, wherein the resin layer 160 fills the hole T and contacts the remaining conductive structure 140e. Next, referring to FIG. 5C again, a solder mask layer 150 is formed on the first structure layer 120d and the resin layer 160. The solder mask layer 150 exposes a part of the first conductive member (that is, the first circuit layer 122d). Then, referring to FIG. 5D, a cavity C5 is formed to penetrate the solder mask layer 150, the first structure layer 120d, and the connecting structure layer 110d to expose the upper surface 131d of the second conductive member (that is, the second circuit layer 132d) of the second structure layer 130d.

Figure 5E:
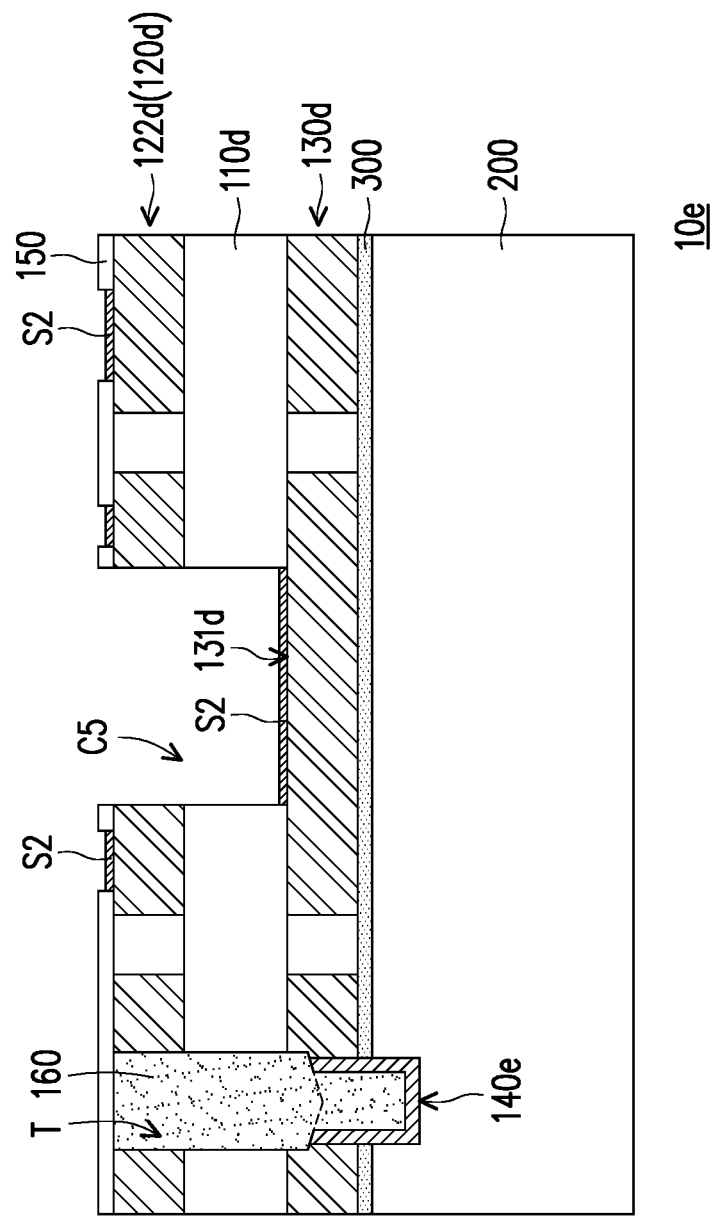

Finally, referring to FIG. 5E, a surface treatment layer S2 is formed on the first conductive member (that is, the first circuit layer 122d) exposed by the solder mask layer 150 and the upper surface 131d of the second conductive member (that is, the second circuit layer 132d) exposed by the cavity C5. At this point, the manufacture of the circuit board 10e is completed.

In terms of structure, referring to FIG. 4D and FIG. 5E, the circuit board 10e of this embodiment is similar to the circuit board 10d described above, and the difference between the two circuit boards is that the conductive structure 140e of this embodiment is only located in the second structure layer 130d, the thermal interface material layer 300, and a part of the thermally conductive substrate 200, and the resin layer 160 fills the hole T extending from the first structure layer 120d and the connecting structure layer 110d to the conductive structure 140e and is connected to the conductive structure 140e. That is, the resin layer 142d (referring to FIG. 4A) and 160 penetrates the first circuit layer 122 of the first structure layer 120d, the connecting structure layer 110d, the second circuit layer 132d of the second structure layer 120d, the thermal interface material layer 200, and a part of the thermally conductive substrate 300, and the electroplated metal layer 144d (referring to FIG. 4A) covers the surfaces of the resin layer 142d penetrating the second circuit layer 132d of the second structure layer 130d, the thermal interface material layer 200, and a part of the thermally conductive substrate 200. Here, the conductive structure 140e is only electrically connected to the second structure layer 130d and the thermally conductive substrate 300, and may be used as a ground.

In summary, in the design of the circuit board of the disclosure, the composite structure layer includes the first structure layer, the second structure layer, and the connecting structure layer. The first structure layer and the second structure layer respectively include conductive members, and the conductive structure connects the conductive members of the first structure layer and the second structure layer, and the second structure layer of the composite structure layer is connected to the thermally conductive substrate through the thermal interface material layer. In this way, the circuit board of the disclosure not only can dissipate heat through the thermally conductive substrate but also has at least two layers of conductive members (for example, circuit layers) for use.

Although the disclosure has been disclosed with reference to the above embodiments, they are not intended to limit the disclosure. Those skilled in the art can make changes and modifications without departing from the spirit and scope of the disclosure. Therefore, the scope of the disclosure is defined by the following claims.

What is claimed is:

1. A circuit board, comprising: a composite structure layer having a cavity and comprising a first structure layer, a second structure layer, and a connecting structure layer, wherein the connecting structure layer connects the first structure layer and the second structure layer, the first structure layer comprises at least one first conductive member and the second structure layer comprises at least one second conductive member, and the cavity penetrates the first structure layer and the connecting structure layer to expose the at least one second conductive member of the second structure layer; at least one conductive structure at least penetrating the connecting structure layer and electrically connected to the at least one first conductive member of the first structure layer and the at least one second conductive member of the second structure layer; a thermally conductive substrate disposed on a side of the composite structure layer; and a thermal interface material layer disposed between the composite structure layer and the thermally conductive substrate, wherein the second structure layer is connected to the thermally conductive substrate through the thermal interface material layer, wherein the first structure layer further comprises an insulating layer, the at least one first conductive member comprises multiple circuit layers, the multiple circuit layers are disposed in the insulating layer and on two opposite surfaces of the insulating layer, the second structure layer further comprises an insulating resin, the at least one second conductive member is a metal plate, the metal plate has a plurality of openings, the insulating resin fills the openings, and the at least one conductive structure passes through the connecting structure layer to electrically connect a bottom circuit layer of the multiple circuit layers and the metal plate.

2. The circuit board according to claim 1, further comprising: a solder mask layer disposed on the first structure layer and exposing a part of the at least one first conductive member, wherein the cavity passes through the solder mask layer, the first structure layer, and the connecting structure layer to expose an upper surface of the at least one second conductive member of the second structure layer.

3. The circuit board according to claim 2, further comprising: a surface treatment layer disposed on the at least one first conductive member exposed by the solder mask layer and on the upper surface of the at least one second conductive member exposed by the cavity.

4. The circuit board according to claim 3, wherein the surface treatment layer is further disposed on a surface of the thermally conductive substrate relatively far away from the composite structure layer.

5. The circuit board according to claim 3, wherein a material of the surface treatment layer comprises electroless nickel electroless palladium immersion gold (ENEPIG), electroless nickel immersion gold (ENIG) or an organic solderability preservative (OSP).

6. The circuit board according to claim 1, wherein a material of the connecting structure layer comprises polypropylene (PP), an Ajinomoto build-up film (ABF), glass fiber (FR4) or a thermal interface material (TIM).

7. The circuit board according to claim 1, wherein a thermal conductivity of the thermal interface material layer is equal to or greater than 8 W/(m·K).

8. The circuit board according to claim 1, wherein a material of the thermally conductive substrate comprises metal or ceramic.

9. A manufacturing method of a circuit board, comprising: providing a composite structure layer, wherein the composite structure layer comprises a first structure layer, a second structure layer, and a connecting structure layer, the connecting structure layer connects the first structure layer and the second structure layer, the first structure layer comprises at least one first conductive member, and the second structure layer comprises at least one second conductive member; forming at least one conductive structure to at least penetrate the connecting structure layer and be electrically connected to the at least one first conductive member of the first structure layer and the at least one second conductive member of the second structure layer; providing a thermally conductive substrate and a thermal interface material layer, wherein the thermal interface material layer is located between the composite structure layer and the thermally conductive substrate; compressing the composite structure layer, the thermal interface material layer, and the thermally conductive substrate so that the second structure layer is connected to the thermally conductive substrate through the thermal interface material layer; and forming a cavity to penetrate the first structure layer and the connecting structure layer to expose the at least one second conductive member of the second structure layer, wherein the at least one conductive structure is formed when the composite structure layer is provided, and providing the composite structure layer comprises: providing the first structure layer, wherein the first structure layer further comprises an insulating layer, the at least one first conductive member comprises multiple circuit layers, and the multiple circuit layers are disposed in the insulating layer and on two opposite surfaces of the insulating layer; providing the at least one second conductive member, wherein the at least one second conductive member is a metal plate, wherein the metal plate has an upper surface and a lower surface opposite to each other, a plurality of first blind holes extending in a direction from the upper surface to the lower surface, and a plurality of second blind holes extending in a direction from the lower surface to the upper surface, and the first blind holes respectively correspond to the second blind holes; providing the connecting structure layer between the first structure layer and the metal plate, wherein the at least one conductive structure passes through the connecting structure layer, and the connecting structure layer is in a B-stage state; compressing the first structure layer, the connecting structure layer, and the metal plate so that the at least one conductive structure is connected to the multiple circuit layers and the metal plate, and the connecting structure layer changes from the B-stage state to a C-stage state; removing a part of the metal plate so that the first blind holes communicate with the second blind holes to define a plurality of openings; and filling an insulating resin in the openings, wherein the insulating resin fills the openings, the insulating resin is flush with two surfaces of the metal plate, and the metal plate and the insulating resin define the second structure layer.

10. The manufacturing method of the circuit board according to claim 9, further comprising: forming a solder mask layer on the first structure layer before the cavity is formed, wherein the solder mask layer exposes a part of the at least one first conductive member, the cavity passes through the solder mask layer, the first structure layer, and the connecting structure layer to expose an upper surface of the at least one second conductive member of the second structure layer.

11. The manufacturing method of the circuit board according to claim 10, further comprising: forming a surface treatment layer on the at least one first conductive member exposed by the solder mask layer and on the upper surface of the at least one second conductive member exposed by the cavity after the solder mask layer is formed.

12. The manufacturing method of the circuit board according to claim 11, wherein the surface treatment layer is further formed on a surface of the thermally conductive substrate relatively far away from the composite structure layer.

13. The manufacturing method of the circuit board according to claim 11, wherein a material of the surface treatment layer comprises electroless nickel electroless palladium immersion gold (ENEPIG), electroless nickel immersion gold (ENIG) or an organic solderability preservative (OSP).

14. The manufacturing method of the circuit board according to claim 9, wherein a material of the connecting structure layer comprises polypropylene (PP), an Ajinomoto build-up film (ABF), glass fiber (FR4) or a thermal interface material (TIM).

15. The manufacturing method of the circuit board according to claim 9, wherein a thermal conductivity of the thermal interface material layer is equal to or greater than 8 W/(m·K).

16. The manufacturing method of the circuit board according to claim 9, wherein a material of the thermally conductive substrate comprises metal or ceramic.

* * * * *